(12) United States Patent
Yoshihara et al.

(10) Patent No.: US 12,635,577 B2
(45) Date of Patent: May 19, 2026

(54) MEMORY DEVICE INCLUDING ARRANGEMENT OF INDEPENDENTLY AND CONCURRENTLY OPERABLE TILES OF MEMORY TRANSISTORS

(71) Applicant: SUNRISE MEMORY CORPORATION, San Jose, CA (US)

(72) Inventors: Masahiro Yoshihara, Yokohama (JP); Tz-Yi Liu, Palo Alto, CA (US); Raul Adrian Cernea, Santa Clara, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 650 days.

(21) Appl. No.: 18/059,974

(22) Filed: Nov. 29, 2022

(65) Prior Publication Data

US 2023/0187413 A1     Jun. 15, 2023

Related U.S. Application Data

(60) Provisional application No. 63/287,786, filed on Dec. 9, 2021.

(51) Int. Cl.
*H01L 25/065*     (2023.01)
*H01L 25/18*     (2023.01)

(52) U.S. Cl.
CPC .......... *H01L 25/0657* (2013.01); *H01L 25/18* (2013.01); *H01L 2225/06541* (2013.01)

(58) Field of Classification Search
CPC ................. H01L 25/0657; H01L 25/18; H01L 2225/06541; G11C 5/025; G11C 7/1048;
(Continued)

(56) References Cited

U.S. PATENT DOCUMENTS 4,213,139 A    7/1980   Rao
4,984,153 A    1/1991   Kregness et al.
(Continued)

FOREIGN PATENT DOCUMENTS

CN    107658317 A    2/2018
CN    108649031 A    10/2018
(Continued)

OTHER PUBLICATIONS

"PCT Search Report and Written Opinion, PCT/US2022/051852", Apr. 26, 2023, 15 pages.
(Continued)

*Primary Examiner* — Fernando Hidalgo

(57) ABSTRACT

In some embodiments, a memory device implements a tile-based architecture including an arrangement of independently and concurrently operable arrays or tiles of memory transistors where each tile includes memory transistors that are arranged in a three-dimensional array and a localized modular control circuit operating the memory transistors in the tile. The tile-based architecture of the memory device enables concurrent memory access to multiple tiles, which enables independent and concurrent memory operations to be carried out across multiple tiles. The tile-based concurrent access to the memory device has the benefits of increasing the memory bandwidth and lowering the tail latency of the memory device by ensuring high availability of storage transistors. In other embodiments, a memory module includes multiple semiconductor memory dies coupled to a memory controller where the semiconductor memory dies are partitioned into independently accessible memory channels with each memory channel being formed across the multiple semiconductor memory dies.

18 Claims, 14 Drawing Sheets

(58) Field of Classification Search

CPC .............. G11C 7/1069; G11C 11/2253; G11C 11/2255; G11C 11/2273; G11C 16/0466; G11C 16/08; G11C 16/24; G11C 16/26; G11C 7/18; G11C 11/223; G11C 8/12; G11C 11/4023; H10B 51/20

USPC .......................................................... 365/63

See application file for complete search history.

(56) References Cited

U.S. PATENT DOCUMENTS

| | | | |
|---|---|---|---|
| 5,388,246 A | 2/1995 | Kasai | |
| 5,583,808 A | 12/1996 | Brahmbhatt | |
| 5,646,886 A | 7/1997 | Brahmbhatt | |
| 5,656,842 A | 8/1997 | Iwamatsu | |
| 5,768,192 A | 6/1998 | Eitan | |
| 5,789,776 A | 8/1998 | Lancaster et al. | |
| 5,915,167 A | 6/1999 | Leedy | |
| 6,040,605 A | 3/2000 | Sano et al. | |
| 6,057,862 A | 5/2000 | Margulis | |
| 6,107,133 A | 8/2000 | Furukawa | |
| 6,118,171 A | 9/2000 | Davies et al. | |
| 6,130,838 A | 10/2000 | Kim et al. | |
| 6,434,053 B1 | 8/2002 | Fujiwara | |
| 6,580,124 B1 | 6/2003 | Cleeves et al. | |
| 6,744,094 B2 | 6/2004 | Forbes | |
| 6,774,458 B2 | 8/2004 | Fricke et al. | |
| 6,873,004 B1 | 3/2005 | Han et al. | |
| 6,881,994 B2 | 4/2005 | Lee et al. | |
| 6,946,703 B2 | 9/2005 | Ryu et al. | |
| 7,005,350 B2 | 2/2006 | Walker et al. | |
| 7,284,226 B1 | 10/2007 | Kondapalli | |
| 7,307,308 B2 | 12/2007 | Lee | |
| 7,489,002 B2 | 2/2009 | Forbes et al. | |
| 7,524,725 B2 | 4/2009 | Chung | |
| 7,612,411 B2 | 11/2009 | Walker | |
| 8,026,521 B1 | 9/2011 | Or-Bach et al. | |
| 8,139,418 B2 | 3/2012 | Carman | |
| 8,178,396 B2 | 5/2012 | Sinha et al. | |
| 8,417,917 B2 | 4/2013 | Emma et al. | |
| 8,630,114 B2 | 1/2014 | Lue | |
| 8,653,672 B2 | 2/2014 | Leedy | |
| 8,767,473 B2 | 7/2014 | Shim et al. | |
| 8,848,425 B2 | 9/2014 | Schloss | |
| 8,878,278 B2 | 11/2014 | Alsmeier et al. | |
| 9,190,293 B2 | 11/2015 | Wang et al. | |
| 9,202,694 B2 | 12/2015 | Konevecki et al. | |
| 9,230,985 B1 | 1/2016 | Wu et al. | |
| 9,256,026 B2 | 2/2016 | Thacker et al. | |
| 9,297,971 B2 | 3/2016 | Thacker et al. | |
| 9,412,752 B1 | 8/2016 | Yeh et al. | |
| 9,455,268 B2 | 9/2016 | Oh et al. | |
| 9,502,345 B2 | 11/2016 | Youn et al. | |
| 9,620,605 B2 | 4/2017 | Liang et al. | |
| 9,633,944 B2 | 4/2017 | Kim | |
| 9,691,485 B1 | 6/2017 | Kumar et al. | |
| 9,748,172 B2 | 8/2017 | Takaki | |
| 9,799,761 B2 | 10/2017 | Or-Bach et al. | |
| 9,842,651 B2 | 12/2017 | Harari | |
| 9,892,800 B2 | 2/2018 | Harari | |
| 9,911,497 B1 | 3/2018 | Harari | |
| 10,074,667 B1 | 9/2018 | Higashi | |
| 10,096,364 B2 | 10/2018 | Harari | |
| 10,121,553 B2 | 11/2018 | Harari et al. | |
| 10,217,719 B2 | 2/2019 | Watanabe et al. | |
| 10,249,370 B2 | 4/2019 | Harari | |
| 10,254,968 B1 | 4/2019 | Gazit et al. | |
| 10,283,452 B2 | 5/2019 | Zhu et al. | |
| 10,283,493 B1 | 5/2019 | Nishida | |
| 10,319,696 B1 | 6/2019 | Nakano | |
| 10,373,956 B2 | 8/2019 | Gupta et al. | |
| 10,381,370 B2 | 8/2019 | Shin et al. | |
| 10,381,378 B1 | 8/2019 | Harari | |
| 10,395,737 B2 | 8/2019 | Harari | |
| 10,431,596 B2 | 10/2019 | Herner et al. | |
| 10,475,812 B2 | 11/2019 | Harari | |
| 10,622,377 B2 | 4/2020 | Harari et al. | |
| 10,644,826 B2 | 5/2020 | Wuu et al. | |
| 10,651,153 B2 | 5/2020 | Fastow et al. | |
| 10,692,837 B1 | 6/2020 | Nguyen et al. | |
| 10,692,874 B2 | 6/2020 | Harari et al. | |
| 10,725,099 B2 | 7/2020 | Ware | |
| 10,742,217 B2 | 8/2020 | Dabral et al. | |
| 10,978,427 B2 | 4/2021 | Li et al. | |
| 11,152,343 B1 | 10/2021 | Dokania et al. | |
| 11,507,301 B2 | 11/2022 | Norman | |
| 11,513,729 B1 | 11/2022 | Ben-Yehuda et al. | |
| 11,728,004 B1* | 8/2023 | Ray .................... | G11C 29/42 |
| | | | 365/185.09 |
| 11,923,341 B2 | 3/2024 | Quader et al. | |
| 2001/0030340 A1 | 10/2001 | Fujiwara | |
| 2001/0053092 A1 | 12/2001 | Kosaka et al. | |
| 2002/0028541 A1 | 3/2002 | Lee et al. | |
| 2002/0051378 A1 | 5/2002 | Ohsawa | |
| 2002/0193484 A1 | 12/2002 | Albee | |
| 2004/0043755 A1 | 3/2004 | Shimooka et al. | |
| 2004/0214387 A1 | 10/2004 | Madurawe et al. | |
| 2004/0246807 A1 | 12/2004 | Lee | |
| 2004/0262681 A1 | 12/2004 | Masuoka et al. | |
| 2004/0262772 A1 | 12/2004 | Ramanathan et al. | |
| 2005/0128815 A1 | 6/2005 | Ishikawa et al. | |
| 2005/0280061 A1 | 12/2005 | Lee | |
| 2006/0080457 A1 | 4/2006 | Hiramatsu et al. | |
| 2006/0155921 A1 | 7/2006 | Gorobets et al. | |
| 2006/0212651 A1 | 9/2006 | Ashmore | |
| 2007/0192518 A1 | 8/2007 | Rupanagunta et al. | |
| 2007/0236979 A1 | 10/2007 | Takashima | |
| 2008/0022026 A1 | 1/2008 | Yang et al. | |
| 2008/0239812 A1 | 10/2008 | Naofumi et al. | |
| 2009/0057722 A1 | 3/2009 | Masuoka et al. | |
| 2009/0089532 A1 | 4/2009 | Wang et al. | |
| 2009/0157946 A1 | 6/2009 | Arya | |
| 2009/0237996 A1 | 9/2009 | Kirsch et al. | |
| 2009/0279360 A1 | 11/2009 | Peter et al. | |
| 2009/0290442 A1 | 11/2009 | Rajan | |
| 2009/0316487 A1 | 12/2009 | Lee et al. | |
| 2010/0036960 A1 | 2/2010 | Kowalewski | |
| 2010/0121994 A1 | 5/2010 | Kim et al. | |
| 2010/0124116 A1 | 5/2010 | Takashi et al. | |
| 2010/0219392 A1 | 9/2010 | Awaya et al. | |
| 2010/0254191 A1 | 10/2010 | Son et al. | |
| 2011/0115011 A1 | 5/2011 | Masuoka et al. | |
| 2011/0134705 A1 | 6/2011 | Jones et al. | |
| 2011/0170266 A1 | 7/2011 | Haensh et al. | |
| 2011/0208905 A1 | 8/2011 | Shaeffer et al. | |
| 2011/0298013 A1 | 12/2011 | Hwang et al. | |
| 2011/0310683 A1 | 12/2011 | Gorobets | |
| 2012/0182801 A1 | 7/2012 | Lue | |
| 2012/0243314 A1 | 9/2012 | Takashi | |
| 2012/0307568 A1 | 12/2012 | Banna et al. | |
| 2012/0311246 A1 | 12/2012 | Mcwilliams et al. | |
| 2013/0007349 A1 | 1/2013 | D'Abreu et al. | |
| 2013/0256780 A1 | 10/2013 | Kai et al. | |
| 2014/0015036 A1 | 1/2014 | Fursin et al. | |
| 2014/0032873 A1 | 1/2014 | Ozdemir et al. | |
| 2014/0040698 A1 | 2/2014 | Loh et al. | |
| 2014/0052912 A1 | 2/2014 | Wang et al. | |
| 2014/0075135 A1 | 3/2014 | Choi et al. | |
| 2014/0117366 A1 | 5/2014 | Saitoh | |
| 2014/0151774 A1 | 6/2014 | Rhie | |
| 2014/0173017 A1 | 6/2014 | Takagi et al. | |
| 2014/0247674 A1 | 9/2014 | Karda et al. | |
| 2014/0328128 A1 | 11/2014 | Louie et al. | |
| 2014/0340952 A1 | 11/2014 | Ramaswamy et al. | |
| 2015/0121000 A1 | 4/2015 | Tanzawa | |
| 2015/0155876 A1 | 6/2015 | Jayasena et al. | |
| 2015/0179269 A1 | 6/2015 | Lee | |
| 2015/0194440 A1 | 7/2015 | Noh et al. | |
| 2015/0220463 A1 | 8/2015 | Fluman et al. | |
| 2015/0249143 A1 | 9/2015 | Sano | |
| 2015/0263005 A1 | 9/2015 | Zhao et al. | |
| 2015/0347331 A1 | 12/2015 | Park et al. | |
| 2015/0372099 A1 | 12/2015 | Chen et al. | |
| 2015/0378890 A1 | 12/2015 | Lien et al. | |
| 2016/0013156 A1 | 1/2016 | Zhai et al. | |

(56) References Cited

U.S. PATENT DOCUMENTS

| | | |
|---|---|---|
| 2016/0019951 A1 | 1/2016 | Park et al. |
| 2016/0035711 A1 | 2/2016 | Hu |
| 2016/0079164 A1 | 3/2016 | Fukuzumi et al. |
| 2016/0086970 A1 | 3/2016 | Peng |
| 2016/0225860 A1 | 8/2016 | Karda et al. |
| 2016/0248631 A1 | 8/2016 | Duchesneau |
| 2016/0314042 A1 | 10/2016 | Plants |
| 2016/0321002 A1 | 11/2016 | Jung et al. |
| 2017/0031619 A1 | 2/2017 | Luan et al. |
| 2017/0092370 A1 | 3/2017 | Harari |
| 2017/0092371 A1 | 3/2017 | Harari |
| 2017/0148517 A1 | 5/2017 | Harari |
| 2017/0148810 A1 | 5/2017 | Kai et al. |
| 2017/0213821 A1 | 7/2017 | Or-Bach et al. |
| 2017/0236590 A1 | 8/2017 | Gueta et al. |
| 2017/0243638 A1 | 8/2017 | Hsu et al. |
| 2017/0358594 A1 | 12/2017 | Lu et al. |
| 2018/0095127 A1 | 4/2018 | Pappu et al. |
| 2018/0108416 A1 | 4/2018 | Harari |
| 2018/0239720 A1 | 8/2018 | Kanoh |
| 2018/0261575 A1 | 9/2018 | Tagami et al. |
| 2018/0269229 A1 | 9/2018 | Or-Bach et al. |
| 2018/0331042 A1 | 11/2018 | Manusharow et al. |
| 2018/0342302 A1 | 11/2018 | Chang et al. |
| 2018/0357165 A1 | 12/2018 | Helmick et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0019564 A1 | 1/2019 | Li et al. |
| 2019/0028387 A1 | 1/2019 | Gray |
| 2019/0043836 A1 | 2/2019 | Fastow et al. |
| 2019/0067327 A1 | 2/2019 | Herner et al. |
| 2019/0108090 A1 | 4/2019 | Shen et al. |
| 2019/0121699 A1 | 4/2019 | Cohen et al. |
| 2019/0130946 A1 | 5/2019 | Sim et al. |
| 2019/0148286 A1 | 5/2019 | Or-Bach et al. |
| 2019/0157296 A1 | 5/2019 | Harari et al. |
| 2019/0171391 A1 | 6/2019 | Dubeyko et al. |
| 2019/0180821 A1 | 6/2019 | Harari |
| 2019/0206890 A1 | 7/2019 | Harari et al. |
| 2019/0214077 A1 | 7/2019 | Oh et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0319044 A1 | 10/2019 | Harari |
| 2019/0325945 A1 | 10/2019 | Linus |
| 2019/0325964 A1 | 10/2019 | Harari |
| 2019/0332321 A1 | 10/2019 | Chen |
| 2019/0341091 A1* | 11/2019 | Sity .................... G06F 11/1616 |
| 2019/0348424 A1 | 11/2019 | Karda et al. |
| 2019/0355747 A1 | 11/2019 | Herner et al. |
| 2019/0370005 A1 | 12/2019 | Moloney et al. |
| 2019/0370117 A1 | 12/2019 | Fruchtman et al. |
| 2019/0384884 A1 | 12/2019 | Thuries et al. |
| 2020/0006306 A1 | 1/2020 | Li |
| 2020/0051990 A1 | 2/2020 | Harari et al. |
| 2020/0098738 A1 | 3/2020 | Herner et al. |
| 2020/0098779 A1 | 3/2020 | Cernea et al. |
| 2020/0176468 A1 | 6/2020 | Herner et al. |
| 2020/0194416 A1 | 6/2020 | Or-Bach et al. |
| 2020/0201718 A1 | 6/2020 | Richter et al. |
| 2020/0227123 A1* | 7/2020 | Salahuddin ............ G11C 16/10 |
| 2020/0243486 A1 | 7/2020 | Quader et al. |
| 2020/0258897 A1 | 8/2020 | Yan et al. |
| 2020/0326889 A1* | 10/2020 | Norman .............. H01L 25/0657 |
| 2020/0341838 A1 | 10/2020 | Hollis |
| 2020/0350025 A1 | 11/2020 | Purahmad et al. |
| 2020/0395328 A1 | 12/2020 | Fastow et al. |
| 2021/0247910 A1 | 8/2021 | Kim et al. |
| 2021/0248094 A1 | 8/2021 | Norman et al. |
| 2021/0265308 A1 | 8/2021 | Norman et al. |
| 2021/0374066 A1* | 12/2021 | Shah ...................... G11C 16/08 |
| 2022/0004321 A1 | 1/2022 | Jiang et al. |
| 2022/0043596 A1 | 2/2022 | Madraswala et al. |
| 2022/0123003 A1* | 4/2022 | Young ................... H10B 43/50 |
| 2022/0367393 A1* | 11/2022 | Shao .................. H01L 25/0657 |
| 2023/0037047 A1 | 2/2023 | Norman |

FOREIGN PATENT DOCUMENTS

| | | |
|---|---|---|
| EP | 3916784 A1 | 12/2021 |
| KR | 20120085591 A1 | 8/2012 |
| WO | 2018236937 A1 | 12/2018 |

OTHER PUBLICATIONS

"PCT Search Report and Written Opinion, PCT/US2022/051849", Mar. 10, 2023, 20 pages.

International Search Report and Written Opinion, PCT/US2023/070949, dated Jan. 12, 2024.

M. O'Connor et al., "Fine-Grained DRAM: Energy-Efficient DRAM for Extreme Bandwidth Systems," 2017 50th Annual IEEE/ACM International Symposium on Microarchitecture (MICRO), Boston, MA, USA, 2017, pp. 41-54.

"EP Extended Search Report EP168690149.3", Oct. 18, 2019.

"European Search Report, EP 16852238.1", Mar. 28, 2019.

"European Search Report, EP17844550.8", Aug. 12, 2020, 11 pages.

"Invitation to Pay Additional Fees (PCT/ISA/206), PCT/US2020/015710", Mar. 20, 2020, 2 pages.

"Notification of Reasons for Refusal, Japanese Patent Application 2018-527740", (English translation), Nov. 4, 2020, 8 pages.

"Partial European Search Report EP 16869049.3", Jul. 1, 2019, pp. 1-12.

"Partial Search Report, European Patent Application No. 20748610.1", Sep. 29, 2022, 13 pages.

"PCT Search Report and Written Opinion, PCT/US2018/038373", Sep. 10, 2018.

"PCT Search Report and Written Opinion, PCT/US2019/014319", Apr. 15, 2019.

"PCT Search Report and Written Opinion, PCT/US2019/052164", Feb. 27, 2020.

"PCT Search Report and Written Opinion, PCT/US2019/052446", Dec. 11, 2019.

"PCT Search Report and Written Opinion, PCT/US2020/015710", Jun. 9, 2020.

"PCT Search Report and Written Opinion, PCT/US2020/017494", Jul. 20, 2020, 13 pages.

"PCT Search Report and Written Opinion, PCT/US2020/065374", Mar. 15, 2021, 17 pages.

"PCT Search Report and Written Opinion, PCT/US2021/016964", Jun. 15, 2021, 19 pages.

"PCT Search Report and Written Opinion, PCT/US2022/15497", Jul. 11, 2022, 20 pages.

Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.

Kim, N. , et al., "Multi-layered Vertical gate NANO Flash Overcoming Stacking Limit for Terabit Density Storage", Symposium on VLSI Tech. Dig. of Technical Papers, 2009, pp. 188-189.

Lue, H.T. , et al., "A Highly Scalable 8- Layer 3D Vertical-gate {VG} TFT NANO Flash Using Junction-Free Buried Channel BE-SONOS Device", Symposium on VLSI: Tech. Dig. of Technical Papers, 2010, pp. 131-132.

Tanaka, T. , et al., "A 768 GB 3b/cell 3D-Floaling-Gate NANO Flash Memory", Digest of Technical Papers, the 2016 EEE International Solid-Slate Circuits Conference, 2016, pp. 142-144.

Wann, H.C. , et al., "High-Endurance Ultra-Thin Tunnel Oxide in Monos Device Structure for Dynamic Memory Application", IEEE Electron Device letters, vol. 16, No. 11, Nov. 1995, pp. 491-493.

International Search Report and Written Opinion, PCT/US2023/070949, dated Jan. 12, 2024, 11 pages.

* cited by examiner

MEMORY DEVICE INCLUDING ARRANGEMENT OF INDEPENDENTLY AND CONCURRENTLY OPERABLE TILES OF MEMORY TRANSISTORS

CROSS REFERENCE TO RELATED APPLICATIONS

This application claims priority to U.S. provisional patent application, Ser. No. 63/287,786, entitled "Memory System Implementing Write Abort Operation For Reduced Read Latency," filed on Dec. 9, 2021, which is incorporated herein by reference in its entirety.

The present application is also related to: (1) U.S. patent application Ser. No. 17/183,154, entitled "Channel Controller For Shared Memory Access," filed Feb. 23, 2021; (2) U.S. patent application Ser. No. 16/776,279, entitled "Device with Embedded High-Bandwidth, High-Capacity Memory using Wafer Bonding," filed on Jan. 29, 2020; (3) U.S. patent application Ser. No. 17/169,212, entitled "QUASI-VOLATILE SYSTEM-LEVEL MEMORY," filed on Feb. 5, 2021; and (4) U.S. patent application Ser. No. 17/666,255, entitled "Memory Interface With Configurable High-Speed Serial Data Lanes For High Bandwidth Memory," filed on Feb. 7, 2022, which applications are incorporated herein by reference in their entireties.

FIELD OF THE INVENTION

The present invention relates to high capacity and high bandwidth memory systems and, in particular, to a memory device including an arrangement of independently and concurrently operable tiles of memory transistors and to memory systems with multi-channel configuration for high bandwidth access.

BACKGROUND OF THE INVENTION

High density memory arrays, such as 3-dimensional arrays of NOR memory strings ("3-D NOR memory arrays"), have been disclosed in, for example, U.S. Pat. No. 10,121,553 ("the '553 patent"), entitled "Capacitive-Coupled Non-Volatile Thin-film Transistor NOR Strings in Three-Dimensional Arrays," filed on Aug. 26, 2016, and issued on Nov. 6, 2018. The '553 patent disclosure is hereby incorporated by reference in its entirety for all purposes. In the '553 patent, storage or memory transistors are organized as 3-dimensional arrays of NOR memory strings formed above a planar surface of a semiconductor substrate. In addition to providing high memory density and capacity, these 3-D NOR memory arrays may be operated to provide memory circuits at highly desirable speeds that rival conventional memory circuits of much lower circuit densities and significantly higher power dissipation, e.g., such as dynamic random-access memories ("DRAMs").

Furthermore, the memory circuits in the '553 patent are sometimes referred to as "quasi-volatile memory" or "QV memory". Like those of a non-volatile memory (NVM), the memory cells of a QV memory each store a data bit as an electric charge in a charge storage material (e.g., ONO). Because of the nature of its charge-storage layer, a typical QV memory cell has a much longer data retention time than a DRAM cell and, hence, requires a lower refresh rate than the DRAM cell. For example, a typical DRAM system is designed to be refreshed every 64 milliseconds; a QV memory with a comparable effective access performance, however, may be refreshed every 10 minutes. The reduced refresh rate provides the QV memory great advantages in a lower power requirement, a reduced heat dissipation, and a higher memory availability which delivers a better host performance.

SUMMARY OF THE INVENTION

The present disclosure discloses a memory device including an arrangement of independently and concurrently operable tiles of memory transistors and to memory systems with multi-channel configuration for high bandwidth access, substantially as shown in and/or described below, for example in connection with at least one of the figures, as set forth more completely in the claims.

In one embodiment, a memory device includes multiple tiles of memory circuits formed on a semiconductor substrate, each tile including a physically isolated array of storage transistors ("memory array") formed above a planar surface of the semiconductor substrate and a modular control circuit formed under the memory array on or in the semiconductor substrate. The memory array includes a three-dimensional array of storage transistors being organized in a number of memory pages of storage transistors where each storage transistor is accessed by a word line and a bit line. The modular control circuit is in communication with the memory array to perform memory operations on one or more memory pages of storage transistors. Each tile is configurable to be individually addressed and independently operated by the associated modular control circuit to perform memory operations in units of memory pages of storage transistors in the memory array in response to memory access commands designated for the tile. Two or more randomly addressed tiles of memory circuits are configurable to perform overlapping memory operation simultaneously.

In other embodiments, a memory module includes multiple semiconductor memory dies, each semiconductor memory die including three-dimensional arrays of storage transistors that are divided into multiple partitions. Corresponding partitions across the multiple semiconductor memory dies form a memory channel and the multiple partitions across the multiple semiconductor memory dies form a first number of independently accessible memory channels. The memory module further includes a memory controller die including a memory control circuitry for accessing and operating the semiconductor memory dies. The semiconductor memory dies are connected to the memory controller die through a set of interconnect structures. The memory control circuitry includes a first number of channel controllers where each channel controller is coupled to operate one of the memory channels to perform memory operations on the storage transistors associated with the respective memory channel independent of the other memory channels and in parallel with memory operations being performed on the storage transistors of the other memory channels.

In some embodiments, a memory module includes multiple semiconductor memory dies, each semiconductor memory die including multiple memory arrays, each memory array including a three-dimensional array of storage transistors. The semiconductor memory dies include a first number of semiconductor memory dies providing a designated memory capacity of the memory module and at least one spare semiconductor memory die providing a redundancy memory capacity. The memory module further includes a memory controller die including a memory control circuitry for accessing and operating the semiconductor memory dies to perform memory operations. The semiconductor memory dies are connected to the memory controller die through a set of interconnect structures. The memory controller receives from a host processor incoming requests for memory operations that are addressed to a first memory address space that spans the first number of semiconductor memory dies and that excludes the at least one spare semiconductor memory die.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

DETAILED DESCRIPTION OF THE INVENTION

Figures 1A, 1B:
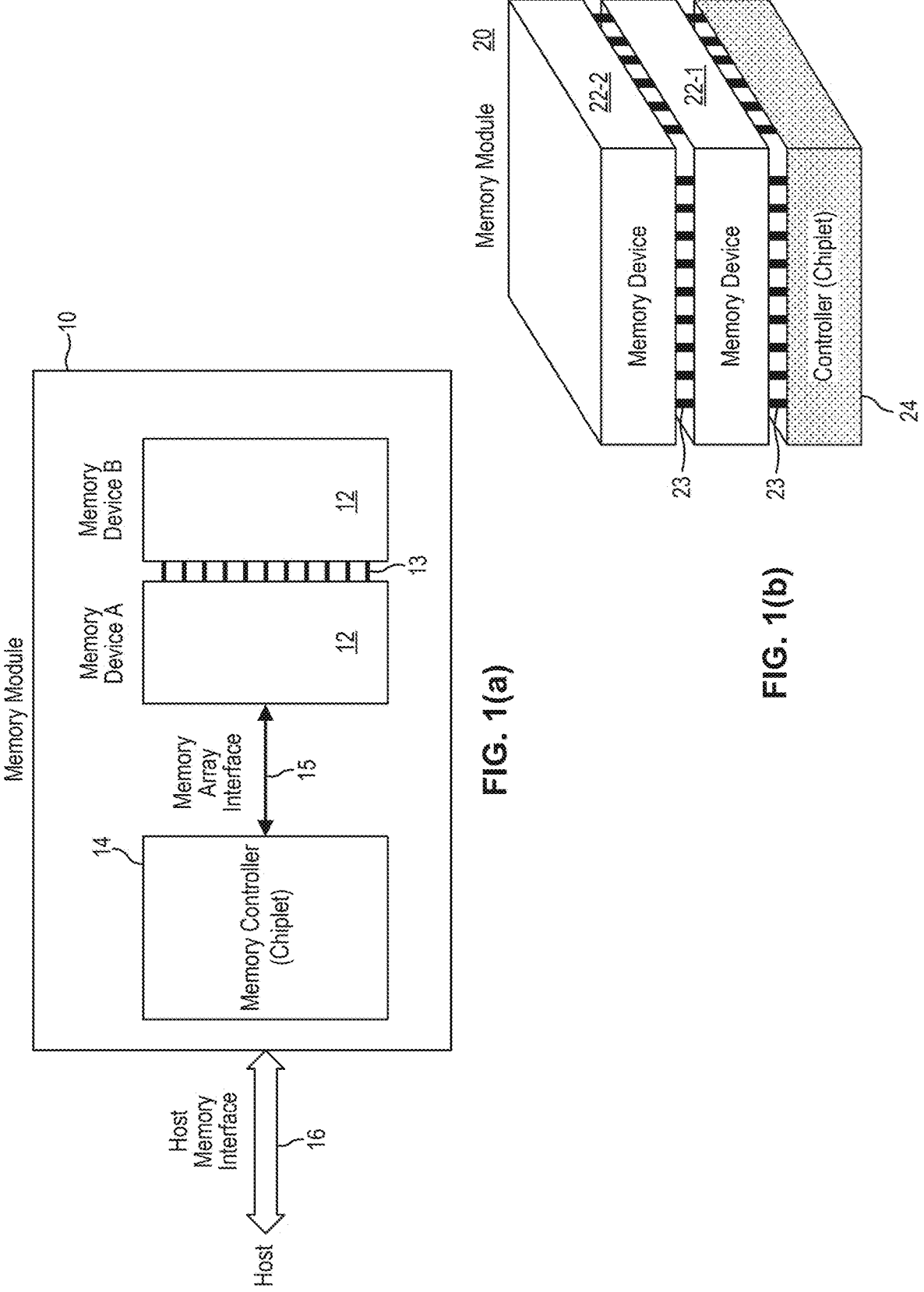
FIG. 1(a) illustrates a memory module in embodiments of the present disclosure.
FIG. 1(b) illustrates a memory module structure formed as stacked memory dies in embodiments of the present disclosure.

According to embodiments of the present invention, a memory module includes multiple semiconductor memory dies coupled to a memory controller where the semiconductor memory dies are partitioned into independently accessible memory channels with each memory channel being formed across the multiple semiconductor memory dies. That is, a memory channel is formed from a memory partition from each of the multiple semiconductor memory dies. The memory controller includes corresponding channel controllers for each memory partition to control memory operations at each memory partition independently of other partitions. As thus configured, the memory module realizes a high capacity memory with a high bandwidth access enabled by the multiple parallel and independently accessible memory channels.

According to other embodiments of the present invention, a memory system includes a memory device of storage (or memory) transistors organized in multiple memory arrays or "tiles" where the memory device interacts with a controller device to perform read and write operations. In one embodiment, each tile is an operating unit for memory access, where a memory access operating unit is referred herein as a "memory bank." In some embodiments, the controller device is configured to issue to the memory device a write command and a write termination command designated for a memory bank, where the write command directs the memory device to initiate a write operation to the designated memory bank in the memory device and the write termination command directs the memory device to terminate the memory operation at a memory bank. In some embodiments, the controller device issues a write abort command as the write termination command to terminate a write operation in progress at a certain memory bank of the memory device in order to issue a read command to the memory device to read data from the same memory bank. In some example, the read command is directed to a memory page in the memory bank different from the memory page at which the write operation was in progress. The terminated write operation can resume after the completion of the read operation.

In the present description, the terms "semiconductor memory die" or "memory die" or "semiconductor memory device" or "memory device" are used interchangeably to refer to a memory circuit of memory or storage transistors formed above or on a semiconductor substrate. In embodiments of the present disclosure, the semiconductor memory device includes three-dimensional arrays of storage transistors. In some embodiments, the semiconductor memory device is constructed using three-dimensional arrays of NOR memory strings formed over a semiconductor substrate, as described in the aforementioned '553 patent. In embodiments of the present disclosure, the semiconductor memory device includes a memory array of quasi-volatile storage transistors and is sometimes referred to as a "quasi-volatile memory" ("QV memory"). Quasi-volatile storage transistors have retention time much longer than typical DRAM memory cells so that a quasi-volatile memory device may be refreshed much less frequently than the typical DRAM memory device. For example, a DRAM memory device needs to refresh the DRAM memory cells every 64 milliseconds while a quasi-volatile memory device may refresh the quasi-volatile storage transistors at an interval of 10 minutes or more. In the present description, a NOR-type memory string includes storage transistors formed above a planar surface of a semiconductor substrate that share a common source region and a common drain region, where each storage transistor can be individually addressed and accessed. In some examples, a three-dimensional array can be formed with the NOR memory strings provided on multiple planes (e.g., 8 or 16 planes) above the semiconductor substrate, with the NOR memory strings on each plane arranged in rows. In the present description, the term "memory device" is also sometimes referred to a single memory die or a set of multiple memory dies coupled to a memory controller.

In the present description, the term "storage transistor" is used interchangeably with "memory transistor" to refer to the data storage structure formed in the memory die described herein. In some examples, the semiconductor memory device of the present disclosure including NOR memory strings of randomly accessible storage transistors (or memory transistors) can have applications in computing systems as the main memory where the data storage locations are directly accessible by the processors of the computer systems, for instance, in a role served in the prior art by conventional random-access memories (RAMs), such as dynamic RAMs (DRAMS) and static RAMs (SRAMs). For example, the memory structure of the present disclosure can be applied in computing systems to function as a random-access memory to support the operations of microprocessors, graphical processors and artificial intelligence processors. In other examples, the memory structure of the present disclosure is also applicable to form a storage system, such as a solid-state drive or replacing a hard drive, for providing long term data storage in computing systems.

In some embodiments, the semiconductor memory device is formed using thin-film storage transistors implementing charge trapping as the data storage mechanism where data is stored in a charge storage film in each storage transistor. For examples, the charge storage film includes a tunneling dielectric layer, a charge trapping layer and a blocking layer, which can be implemented as a multilayer including silicon oxide, silicon nitride, and silicon oxide, arranged in this order and referred to as an ONO layer. An applied electrical field across the charge storage film adds or removes charge from charge traps in a charge trapping layer of the charge storage film, altering the threshold voltage of the storage transistor to encode a given logical state to the storage transistor.

In other embodiments, the semiconductor memory device is formed using ferroelectric field-effect transistors as the storage transistors. More specifically, a ferroelectric field-effect transistor (referred herein as ferroelectric transistors or FeFETs) is formed by using a ferroelectric material as the gate dielectric layer between the gate conductor and the channel of a field-effect transistor. The ferroelectric transistor realizes memory function by storing data as polarization states in the ferroelectric gate dielectric layer (also referred to as the "ferroelectric dielectric layer"). In particular, a voltage applied to the gate conductor induces electrical polarization in the ferroelectric dielectric layer, which polarization can be reversed with application of a voltage in the opposite polarity. The induced polarization states of the ferroelectric dielectric layer change the threshold voltage of the ferroelectric transistor. The change or shift in the threshold voltage of the ferroelectric transistor due to the different polarization states can be used to represent data in different logical states. For example, two logical states (e.g., "0" and "1") can be represented by the higher and lower threshold voltages of the ferroelectric transistor as a result of two induced electrical polarization states in the ferroelectric dielectric layer. Three-dimensional arrays of NOR memory strings of thin-film ferroelectric transistors have been disclosed in, for example, U.S. patent application Ser. No. 17/812,375, entitled "3-Dimensional Memory String Array Of Thin-Film Ferroelectric Transistors," of Christopher J. Petti et al., filed on Jul. 13, 2022, which application is incorporated herein by reference in its entirety.

In some embodiments, the ferroelectric dielectric layer is a doped hafnium oxide layer. In some examples, the doped hafnium oxide layer may include one or more of: zirconium-doped hafnium oxide (HZO), silicon-doped hafnium oxide (HSO), aluminum zirconium-doped Hafnium oxide (HfZrAlO), aluminum-doped hafnium oxide ($HfO_2$:Al), lanthanum-doped hafnium oxide ($HfO_2$:La), hafnium zirconium oxynitride (HfZrON), hafnium zirconium aluminum oxide (HfZrAlO) and any hafnium oxide that includes zirconium impurities.

In yet other embodiments, the 3-dimensional array of NOR memory strings is formed using junctionless ferroelectric storage transistors. That is, the ferroelectric storage transistors do not include p/n junction as the drain or source region in the channel. Instead, the drain and source regions are formed by conductive layers, such as a metal layer, and the semiconductor channel region is formed of an amorphous oxide semiconductor material, such as indium gallium zinc oxide (IGZO). In some examples, the source/drain conductive layers can be formed from a metal layer or a low resistivity metallic conductive material, such as molybdenum (Mo), tungsten (W), tungsten nitride (WN), ruthenium or titanium tungsten alloy (TiW). In some examples, the semiconductor channel region may be formed from other oxide semiconductor materials, such as indium zinc oxide (IZO), indium tungsten oxide (IWO), or indium tin oxide (ITO). Three-dimensional arrays of NOR memory strings of thin-film junctionless ferroelectric transistors have been disclosed in, for example, U.S. patent application Ser. No. 17/936,320, entitled "Memory Structure Including Three-Dimensional NOR Memory Strings Of Junctionless Ferroelectric Memory Transistors And Method Of Fabrication," of Eli Harari, filed on Sep. 28, 2022, which application is incorporated herein by reference in its entirety.

FIG. 1(a) illustrates a memory module in embodiments of the present disclosure. Referring to FIG. 1(a), a memory module 10 is built in a multi-die manner with one or more semiconductor memory dies 12 each with memory arrays formed thereon and a memory controller die 14 ("memory controller") with control circuitry formed thereon. In the example shown in FIG. 1(a), the memory module 10 includes two semiconductor memory dies 12—memory die A and memory die B—that are connected by interconnect structures 13, such as through-silicon vias (TSV). The memory dies 12 communicate with the memory controller 14 through a memory array interface 15. In some embodiments, the memory array interface 15 is a high-bandwidth data interface implemented on interconnect structures that connect the memory dies 12 to the controller die 14, such as TSV or hybrid bonds. The memory controller 14 also includes one or more external interfaces, such as memory interfaces for host access and other system functions. For example, the memory controller 14 includes a host interface 16 for communicating with a host processor, such as to receive requests from the host to read data from or write data to the memory module 10 and to transmit responses to the host, such as write completion response or the read data.

In the present description, a "memory module" refers to one or more semiconductor memory dies coupled to an associated memory controller die to form a high density and high capacity memory system. Each semiconductor memory die (also referred to as "memory die" or "memory device") includes multiple three-dimensional arrays of storage transistors, also referred to as memory transistors or memory cells, for storing memory data. In the present description, the memory controller die is sometimes referred to as "a memory controller," "a controller die," "a controller device," or "a chiplet," and includes control circuit for accessing and operating the memory devices and performing other memory control functions, such as data routing and error correction. The control circuit may also include one or more external interfaces, such as a memory interface for host access. In the present embodiment, the memory module is built as a multi-die structure with the memory device formed on one semiconductor die and the memory controller formed on a separate semiconductor die. The memory die and the memory controller die may be integrated using a variety of integration techniques, such as using TSVs, hybrid bonds, exposed contacts, interposers, printed circuit boards and other suitable interconnect techniques, especially techniques for high density interconnects.

As thus configured, the memory module 10 of the present disclosure integrates one or more semiconductor memory dies with one memory controller die to realize a high capacity memory system with faster memory controller operations and faster memory performance. In addition, the memory dies and the controller die can be separately fabricated using specialized manufacturing processes to optimize the performance of each integrated circuit. More specifically, the memory module 10 can be built using a fabrication process that is optimized for memory circuits and a fabrication process that is optimized for the memory controller. For example, the memory controller may be fabricated using a manufacturing process that is optimized for forming low-voltage and fast logic circuits. In this manner, the performance of the memory circuit and the performance of the memory controller can be individually optimized to realize a memory module 10 with high capacity, high bandwidth and faster memory operations.

In one embodiment, the memory controller is formed as a discrete semiconductor die or integrated circuit customized for use as a memory controller, for example, as an application-specific integrated circuit. In another embodiment of the present invention, the memory controller may be implemented in a general purpose integrated circuit (e.g. a central processing unit (CPU), a graphic processing unit (GPU), a communication chip, or a field programmable gate array). The functional blocks forming the memory controller are embedded in the general purpose integrated circuit and the memory array interface of the memory controller are electrically and physically connected to the memory device, using one of the techniques described above. As thus configured, the embedded memory controller does not include a host interface circuit but can communicate directly with the logic circuits through interconnect lines formed in or on the general purpose integrated circuit. Such a configuration is sometimes referred to as "in memory compute." In memory compute is particularly desirable in artificial intelligence and machine learning applications that are data intensive, and which require a great deal of memory in close proximity to the CPU or GPU core processor, which is embedded with the memory controller functional blocks.

FIG. 1(b) illustrates a memory module structure formed as stacked memory dies in embodiments of the present disclosure. For example, the memory module 10 of FIG. 1(a) may be formed by stacking two or more memory dies and integrating the stacked memory dies with a memory controller die, as shown in FIG. 1(b). Referring to FIG. 1(b), a memory module 20 includes multiple memory devices 22 formed stacked one upon another. For example, the memory module 20 includes a memory device 22-1 and a memory device 22-2 formed stacked one on top of another. The stacked memory devices 22 (or "memory stack") is then integrated with a controller die 24. In some embodiment, the memory stack is interconnected to the controller die 24 through through-silicon vias 23 ("TSV") formed in and through the memory devices 22 and connecting to contact pads on the controller die 24. In other embodiments, other methods to interconnect the stacked memory devices 22 to the controller die 24 may be used, such as hybrid bonds or copper studs, interposers or other suitable interconnect methods. By integrating multiple memory dies in the stack, a memory module 20 can realize a high capacity memory circuit within a small footprint. The resulting advantage is especially significant when multiple memory dies are stacked to provide high memory capacity, while sharing a memory controller among the multiple memory dies to achieve a reduced cost-per-unit.

Memory Channel Configuration

Figures 2A, 2B:
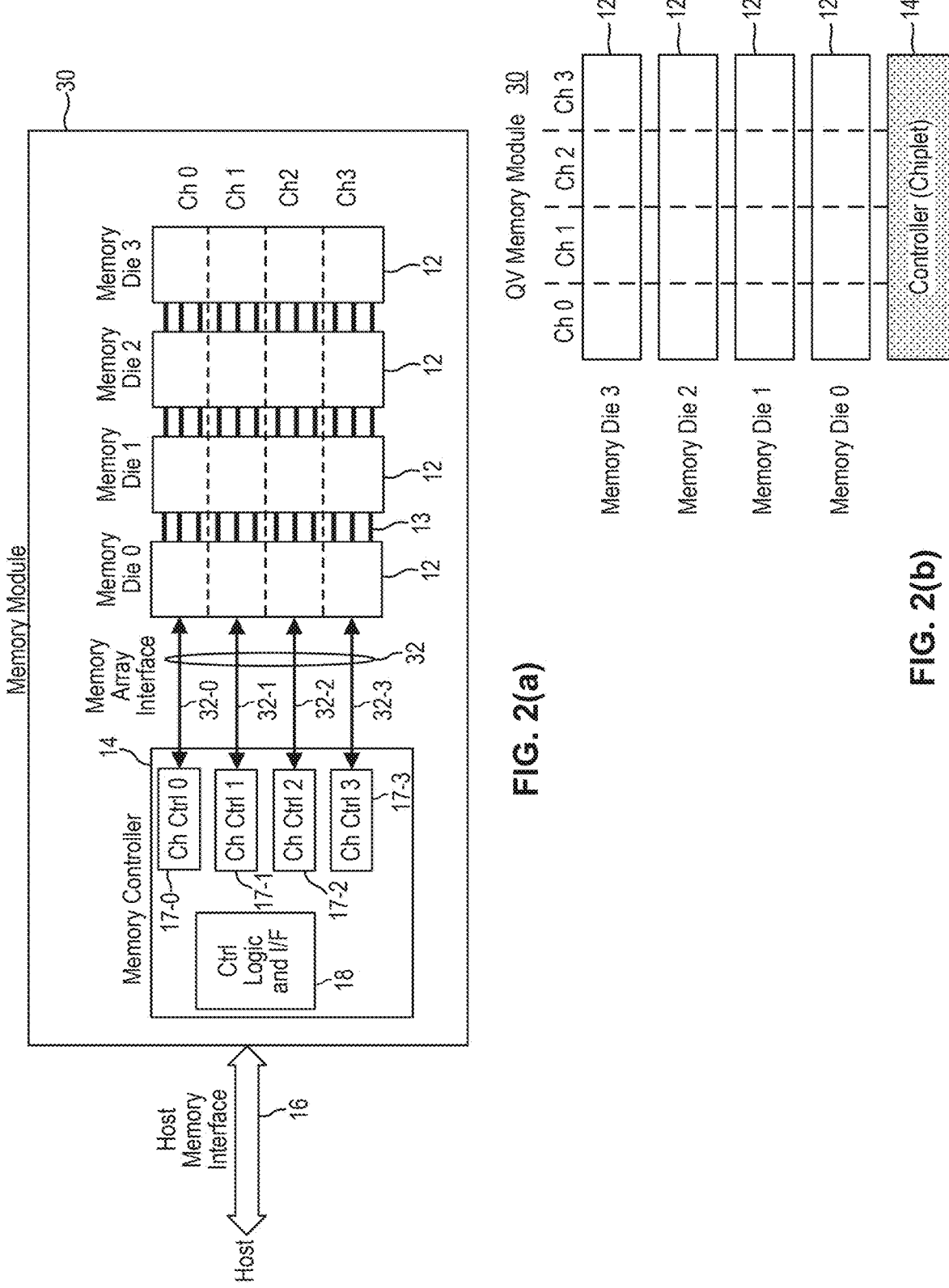
FIG. 2(a) illustrates a memory module configured with independently accessible memory channels in embodiments of the present disclosure.
FIG. 2(b) illustrates the memory module 30 in a stacked memory die configuration in some embodiments.

FIG. 2(a) illustrates a memory module configured with independently accessible memory channels in embodiments of the present disclosure. Like elements in FIGS. 1(a) and 2(a) are given like reference numerals to simplify the discussion. Referring to FIG. 2(a), a memory module 30 includes multiple semiconductor memory dies 12 that are connected together through interconnect structures 13, such as TSV. In the present example, four memory dies 12 are included, labeled as Memory Die 0 to Memory Die 3. The memory dies 12 communicates with the memory controller 14 through a memory array interface 32. The memory controller 14 includes one or more external interfaces, such as a memory interface 16 for communicating with a host or host processor.

In embodiments of the present disclosure, each memory die 12 is partitioned into N number of partitions and corresponding partitions across all of the memory dies 12 are grouped to form N independently accessible memory channels, N being an integer great than 1. In the present embodiment, four memory channels are provided, illustrated as memory channels Ch 0 to Ch 3. In other embodiments, the memory module may be partitioned into a suitable number of memory channels based on factors such as bandwidth and/or reliability or quality of service requirements. As thus configured, each memory channel operates independently of each other to provide memory functions using the storage transistors within the channel partitions. The memory controller 14 operates each memory channel independently and in parallel of the other channels to perform memory operations, such as read or write operations. The memory array interface 32 provides individual memory channel interface for each memory channel. That is, the memory channels Ch 0 to Ch 3 are independently accessible over respective memory channel interfaces 32-0 to 32-3. In embodiments of the present invention, the memory controller 14 includes channel controllers 0-3, denoted as 17-0 to 17-3, to access respective memory channels Ch n over the respective memory array interface 32-n. The memory controller 14 includes logic circuitry 18 which includes the control circuits for controlling the channel controllers 17-n, the host interface circuit for communicating with the host over the memory interface 16, and other circuitry for controlling the memory operation. The memory controller 14 directs incoming read or write requests received from the host to respective channel controllers 17-*n* to store memory data into or retrieve memory data out of the corresponding memory channels. By partitioning and operating the memory dies 12 as individually accessible memory channels, the memory module 30 is capable of providing high bandwidth data transfer for the host.

A salient feature of the memory channel configuration in memory module 30 is that each memory channel is formed across the multiple semiconductor memory dies 12 and each memory channel is individually controlled by respective channel controller in the memory controller 14. That is, memory channel Ch 0 is formed from partitions in memory die 0 to memory die 3. Similarly, memory channels Ch1 to Ch3 are each formed from partitions in memory dies 0 to memory die 3. The memory channel configuration of the present invention is particularly advantageous when applied in a memory module with a stacked memory die configuration. FIG. 2(*b*) illustrates the memory module 30 in a stacked memory die configuration in some embodiments. In the stack memory die configuration, the memory dies 0-3 are stacked one on top of another and the memory stack is then further formed stacked on the memory controller 14, with interconnect structures connecting the stacked memory dies 0-3 to the memory controller 14. In embodiments of the present invention, each memory die 12 is partitioned into N number of memory partitions. The corresponding memory partitions across the multiple stacked memory dies 12 form a memory channel. In other words, each memory channel Ch n includes memory partitions from memory die 0 to memory die 3. In the illustration shown in FIG. 2(*b*), a memory channel Ch n can be seen as being formed vertically across the stacked memory dies. The N number of memory channels are formed in parallel with each other across the stacked memory dies. With each memory channel being provided with its own channel controller, each memory channel can be individually controlled and accessed in parallel to receive incoming memory data and to provide memory output data.

The memory channel configuration of the present invention implemented in memory module 30 has several advantages. First, the memory channel configuration can be adapted to any number of memory dies 12 used to form the memory module. For N number of memory channels, the memory controller 14 can be easily modified to address any number of memory dies included in the memory stack merely by configuring the memory address bits designated for selecting a memory die from the memory channel. Accordingly, the memory channel configuration of the present invention enables a scalable design for the memory module. Second, the memory channel configuration enables the memory controller to take advantage of parallelism in memory access, resulting in more efficient utilization of the storage transistors on each memory die. In operation, the memory controller 14 distributes the memory access among the N memory channels which minimizes access conflicts and increases utilization of the large number of storage transistors formed on each memory die 12. The memory channel configuration of the present invention enable a large number of storage transistors to be accessed concurrently and in parallel over the N number of channels, realizing high bandwidth memory access.

Figure 3:
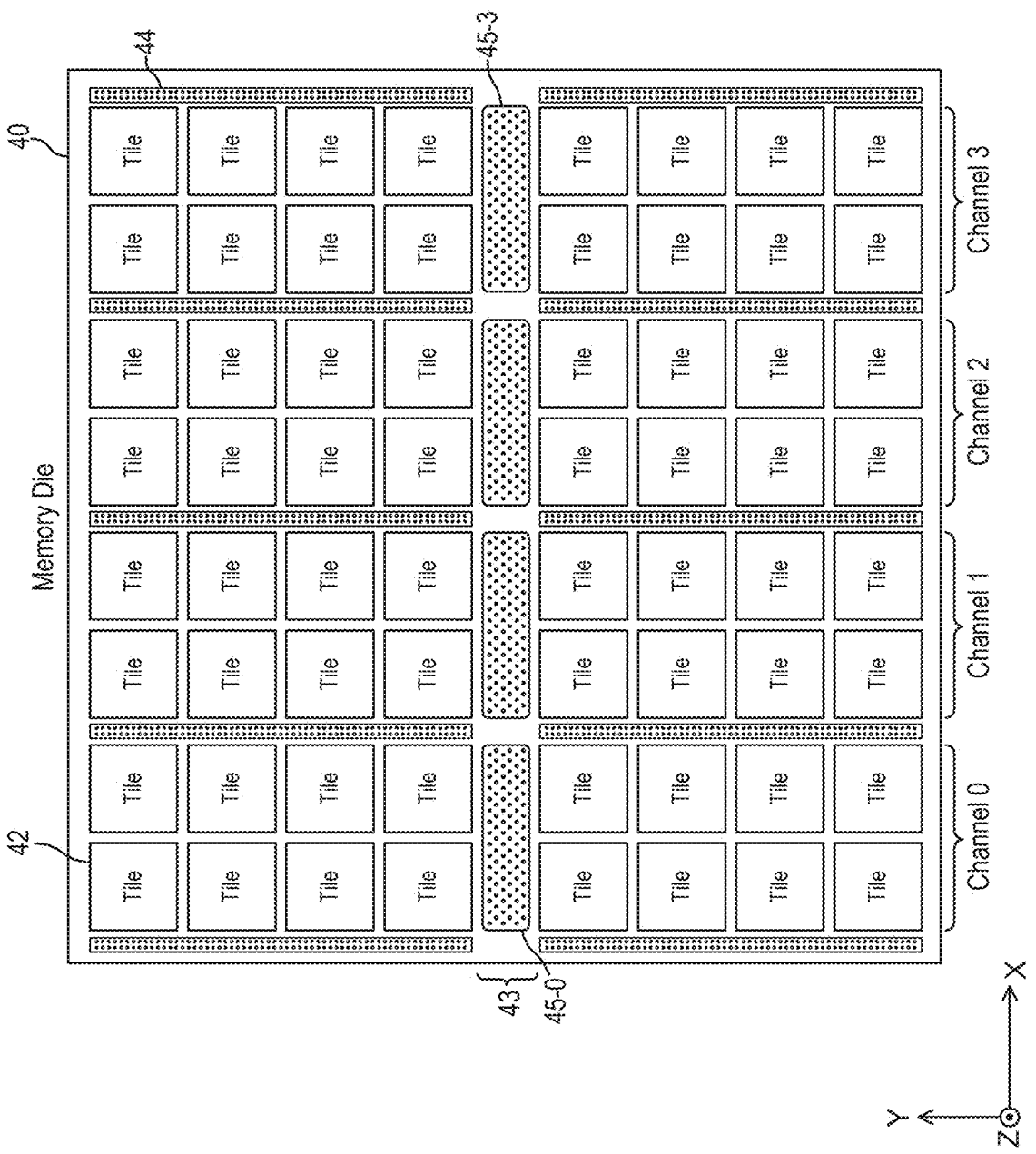
FIG. 3 is a top view of a semiconductor memory die illustrating the organization of storage transistors in embodiments of the present disclosure.

FIG. 3 is a top view of a semiconductor memory die illustrating the organization of storage transistors in embodiments of the present disclosure. Referring to FIG. 3, a semiconductor memory die (or memory device) 40 includes multiple three-dimensional arrays ("memory arrays") of thin-film storage transistors where the memory arrays are organized as a 2-dimensional array of "tiles" 42 (i.e., the tiles are arranged in rows and columns) formed on or in a semiconductor substrate. Each tile 42 (also referred to as "memory tile") includes a three-dimensional array of thin-film storage transistors formed above a planar surface of the semiconductor substrate. In the present description, a tile 42 in the memory die 40 refers to a physically isolated array of memory cells with localized modular control circuit where the tile can be operated concurrently with other tiles and each tile performing memory operations based on an access unit of memory data, for example, a page of memory data. Accordingly, a tile 42 in the memory die 40 refers to a regular array of addressable modular structure of memory cells placed in a regular manner. In some embodiments, each tile 42 includes a memory array of quasi-volatile storage transistors that are organized as 3-dimensional arrays of NOR memory strings. In the present description, the memory arrays in the memory die 40 are sometimes referred to as quasi-volatile memory circuits.

In memory die 40, each tile 42 can be configured to be individually and independently addressed. In embodiments of the present invention, each tile 42 is used as an operating unit for memory access, which is referred to as a "memory bank" or a "bank." Accordingly, a memory bank consists of one tile as the memory access operating unit and each tile or memory bank operates on one access unit of memory data (e.g. a page of memory data or a "memory page") for each memory operation. That is, each memory access from the host is based on an access unit of memory data, where the access unit is referred to as a page of memory data or a memory page. In memory die 40, each memory bank includes one tile where the single tile alone provides the entire access unit of memory data or the entire memory page of memory data. For example, each memory page may include 512 bits of memory data. This is in contrast to conventional memory devices where a memory die includes multiple memory banks with each memory banks providing only a portion of the access unit of memory data and the entire access unit of memory data has to be obtained by combining memory data from multiple memory banks.

More specifically, in some embodiments, each tile is organized into multiple memory pages of storage transistors, each memory page including a subset of storage transistors in the tile. For example, a memory page may include 512 storage transistors and a tile may include over 120K memory pages of storage transistors. As thus organized, the storage transistors in the memory device are accessed in units of a memory page having a given byte size, that is, each read or write operations to the memory device are performed in units of a memory page. In one example, the memory device may be accessed in a memory page size of 64 byte or 512 bits.

In the embodiments described herein, a memory bank is described as consisting of one tile. In other embodiments, one or more tiles may be configured to form a memory access operating unit or a memory bank. For example, a row of tiles or a 2-dimensional block of tiles may be configured to be addressed together as a memory bank. In other words, in alternate embodiments, a memory bank may include a single tile 42 or a block of tiles, such as a row or a section of tiles. As thus configured, the tile 42 is a building block that allows flexibility in configuring the memory module to adapt to application requirements.

In the present description, a "tile" refers to a physically isolated memory array of memory cells with a localized modular control circuit while a "memory bank" refers to an operating unit or a logical unit of memory access. In the present description, a memory bank includes one tile and the term "memory bank" or "bank" is sometimes used interchangeably with the term "tile" to refer to the memory access operating unit consisting of a single tile or single physically isolated memory array. It is instructive to note that, in general, a "tile" refers to the physical memory array while a "memory bank" refers to the logical memory access operating unit.

On the memory die 40, support circuitry for operating the thin-film storage transistors of each tile are formed locally on or in the semiconductor substrate under the memory array. In some embodiments, the support circuitry for each tile are localized and are provided for modularity in the portion of the semiconductor substrate underneath each respective memory array. The tile-based support circuits, also referred to as modular control circuits or "circuit under array" ("CuA"), may include various voltage sources for power supply, ground, programming, erase or read voltages, sense amplifiers, various data latches and registers, various logic circuits, various analog circuits, and other circuits used in memory operations. Example logic circuits include timing control, address decoders, redundancy logic and control circuits. Example analog circuits include data driver, word line and bit line drivers and select transistors, and bias control transistors. Furthermore, in embodiments of the present disclosure, each CuA includes a state machine or a sequencer to execute instructions to be carried out at the associated tile. With each CuA incorporating a sequencer which functions as a local processor for the CuA, the CuA forms an intelligent control circuit to enable each tile to be operated in an independent and self-contained manner and to enable multiple tiles to be operated concurrently and independently.

In operation, the sequencer in each CuA associated with each tile receives commands from the controller circuit directed to the associated tile and decodes the commands to execute memory operations at the associated tile. For example, the sequencer performs read and write operations at the associate tile in response to commands received from the controller device, with the sequencer issuing instructions to execute the entire read operation sequence or write operation sequence at the memory page in the tile designated by the memory address associated with the memory operation. Importantly, on the memory die 40, the complete circuitry of the localized modular control circuit (CuA) is replicated for each tile so that each tile can be operated independently to perform memory operations in response to commands from the controller device addressed to the particular tile.

In embodiments of the present invention, the tile-based support circuits are formed in the semiconductor substrate using a first fabrication process and then the semiconductor substrate with the tile-based support circuits formed thereon is provided in a second fabrication process to form the thin-film storage transistors.

As thus configured, each tile 42 in the memory die 40 operates as a semi-autonomous mini-array of memory cells within the memory die 40. With the support circuitry of the intelligent CuA, each tile 42 can be operated semi-autonomously and independently of other tiles in the memory die 40. The tiles 42, each with its own associated CuA, enable concurrent memory access to a large number of storage transistors in memory die 40 to increase memory throughput and reduce latency. In some embodiments, two neighboring tiles may share certain support circuitry in the CuA. For example, a tile may include a set of sense amplifiers which is shared with a neighboring tile. Each tile, when selected for access, uses its own set of sense amplifiers and the set of sense amplifiers in the neighboring tile. In this case, the neighboring tile, for which the set of sense amplifiers has been borrowed for use, may be marked as non-accessible until the operation on the borrowed sense amplifiers is complete.

In the embodiment shown in FIG. 3, the memory die 40 is illustrated as including tiles arranged in 8 rows and 8 columns. The embodiment shown in FIG. 3 is illustrative only and not intended to be limiting. In one example, a memory die may include 1024 tiles arranged in 32 rows and 32 columns or 2048 tiles arranged in 64 rows of 32 columns. The number of tiles and the arrangement of tiles in the memory die 40 can be selected based on various design factors, such as the size and dimension of the memory die or the placement of interconnect structures.

In embodiments of the present disclosure, the memory die 40 is divided into multiple partitions to form separate memory channels by dividing the two-dimensional array of tiles. In the present embodiment, the memory die 40 is divided by the tile columns into four partitions, forming four memory channels Ch 0 to Ch 3. In the present example, each memory channel (Ch 0 to Ch 3) includes two columns of 8 tiles, for a total of 16 tiles per memory channel. In another example, in a memory die with 1024 tiles, the memory die may be divided by tile columns into 8 partitions, forming eight memory channels, with each memory channel including four columns of 32 tiles, for a total of 128 tiles per memory channel.

In embodiments of the present disclosure, the memory die 40 includes a data interface area 43 for forming the interconnect structures 45 for connection to the memory controller. In the present embodiment, the data interface area is provided in the middle of the memory die, positioned between the two halves of the tile columns. Furthermore, to support the memory channel configuration, the interconnect structures 45 are partitioned according to the channel configuration to provide interconnect structures 45-0 to 45-3 for each memory channel Ch 0 to Ch 3. For example, the interconnect structures 45 are TSVs and each memory channel is provided with a dedicated set of interconnect structures or TSVs for transferring data for that memory channel to and from the memory controller, or more particularly, to the associated channel controller in the memory controller. As shown in FIG. 3, the memory die 40 may include additional sets of interconnect structures 44 for supplying the power and ground connections to the memory arrays formed in the tiles 42. In some embodiments, multiple memory dies 40 are used to form a memory stack, which is then stacked on the memory controller to form a memory module, as shown in FIG. 2(*b*). In a memory stack, a memory channel is formed by the tiles in the same channel partition across all of the memory dies in the memory stack.

FIG. 4(*a*) illustrates a memory structure including a three-dimensional array of NOR memory string in some examples. In embodiments of the present disclosure, the memory structure of FIG. 4(*a*) is used to form the three-dimensional array of storage transistors in a tile of the memory die 40 in FIG. 3. Various methods for forming three-dimensional NOR memory strings are described in the aforementioned '553 patent. Referring to FIG. 4(*a*), a memory structure 50 includes thin-film storage transistors 60 formed as NOR memory strings along a horizontal direction (the Y-direction) in multiple planes, each plane being formed by a set of active layers 56. In particular, the memory structure 50 includes a number of active layers 56 formed on a planar surface of a semiconductor substrate 52. A buffer oxide layer 54 may be provided between the semiconductor substrate 52 and the active layers 56. The active layers 56 are formed one on top of another in the Z-direction (i.e., along a direction normal to the planar surface of the substrate 52) and separated from each other by an isolation dielectric layer 55, such as a silicon oxide carbide (SiOC) layer. The active layers 56 are divided in the X-direction into narrow strips ("active strips") 57 that are stacked one on top of another to form stacks of active strips ("active stacks") extending in the Y-direction.

Each active layer 56 includes first and second doped semiconductor layers 62, 64 (e.g., $n^+$ polysilicon or heavily doped n-type polysilicon) separated by a dielectric layer 63 (e.g., silicon oxide). The first and second doped semiconductor layers 62, 64 form the drain and source regions of the storage transistor 60. Each active layer 56 may include one or more conductive layers 61, 65 (e.g., titanium nitride (TiN)-lined tungsten (W)). Each conductive layer 61 or 65 is formed adjacent one of the doped semiconductor layers 62, 64 to reduce the resistivity of the doped semiconductor layer it contacts. During intermediate processing steps, the active layer may include sacrificial layers (e.g., silicon nitride or carbon) to be subsequently replaced by final conductive layers. Subsequent processing steps form the channel regions 66 (e.g., $p^-$ polysilicon or lightly doped p-type polysilicon), the charge storage films 67, and the gate conductors or gate electrodes 68 (e.g., TiN-lined W) in narrow trenches between the separated active stacks. The gate electrodes 68 and the charge storage films 67 are formed as columnar structures extending in the Z-direction. In the present example, the charge storage film 67 encircles the gate electrode 68 in the columnar structure. In the present description, the gate electrodes 68 are also referred to as "local word lines" and a gate electrode 68 encircled by a charge storage film 67 is collectively referred to as a local word line (LWL) structure 58.

Figure 4A:
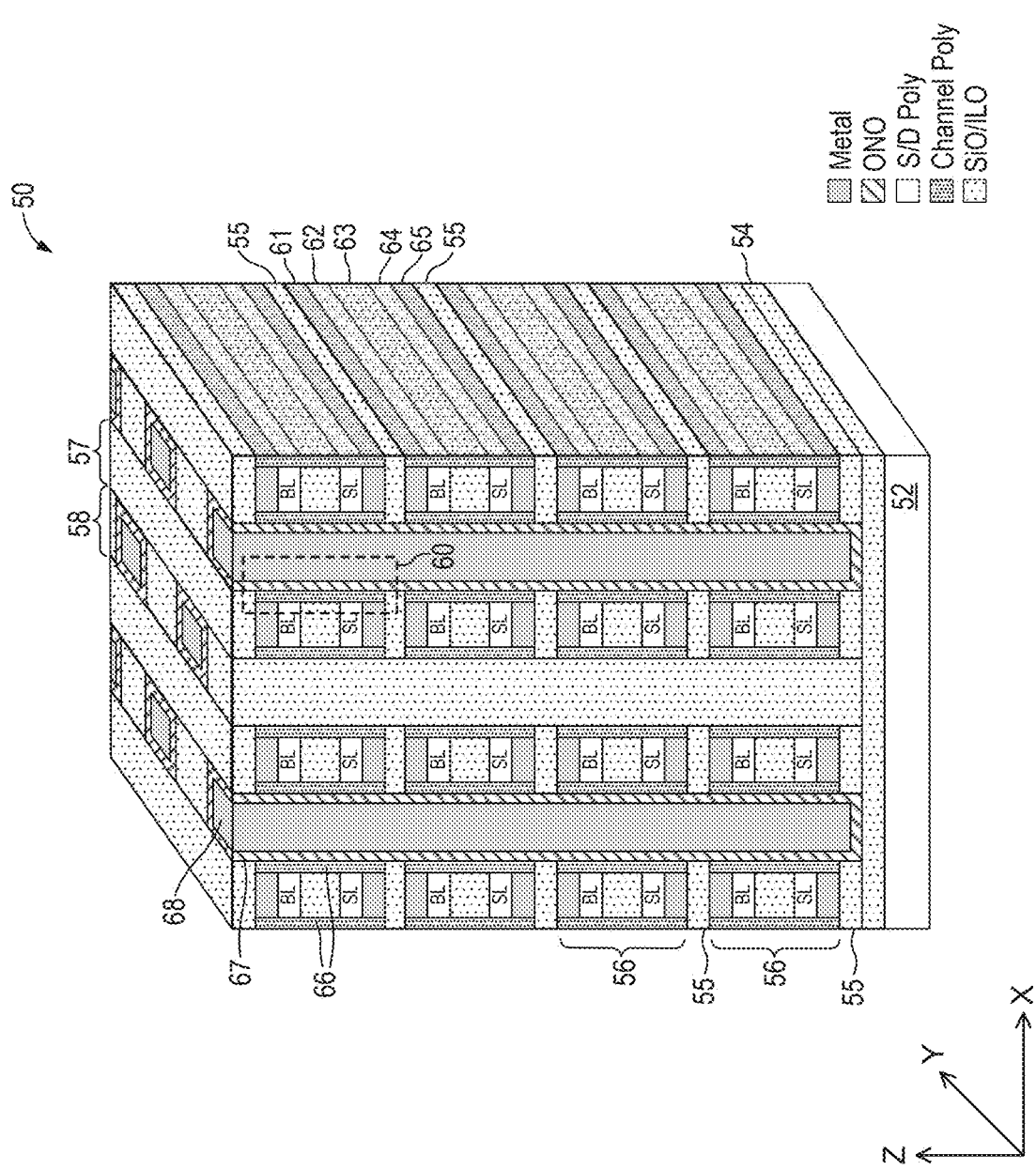
FIG. 4(a) illustrates a memory structure including a three-dimensional array of NOR memory string in some examples.

In the embodiment illustrated in FIG. 4(a), the storage transistors in the three-dimensional memory array are charge-trapping type storage transistors and the charge storage films 67 include a tunneling dielectric layer, a charge trapping layer and a blocking layer. The tunneling dielectric layer may be any silicon oxide (SiOx), silicon nitride (SixNy), silicon oxide nitride (SiON), any aluminum oxide (AlOx), any hafnium oxide (HfOx), zirconium oxide (ZrOx), any hafnium silicon oxide (HfSixOy), any hafnium zirconium oxide (HfZrO), or any combination thereof. The charge trapping layer may be a multilayer and may include any silicon nitride (SixNy), hafnium oxide ($HfO_2$), or hafnium silicon oxynitride (HfSiON). The blocking layer may be any silicon oxide (SiOx), aluminum oxide, or both. In one example, the charge storage films 67 is referred to as an ONOA file and includes a silicon oxide layer (SiOx), a silicon nitride layer (SiN), a silicon oxide layer (SiOx), and an aluminum oxide layer ($Al_2O_3$) that are stacked in this order from the channel layer side toward the gate conductor layer.

The first and second doped semiconductor layers of each active strip form a source region 64 ("common source line") and a drain region 62 ("common bit line") of the storage transistors which may be formed along one or both sides of the active strip 57. In particular, the storage transistor 60 is formed at the intersection of an active strip 57 with the channel region 66 and an LWL structure 58. In the present illustration, the LWL structures 58 are formed staggered in adjacent trenches bordering an active strip 57 so that storage transistors formed on both sides of an active strip are offset from each other in the Y-direction along the memory string. In the case the storage transistor is a ferroelectric storage transistor, the first and second doped semiconductor layers 61, 65 are omitted and the conductive layers 61, 65 act as the source and drain terminals, as will be explained in more detail below.

As thus constructed, the storage transistor 60 is formed by the first doped semiconductor layer 62 forming the drain region (the common bit line), the second doped semiconductor layer 64 forming the source region (the common source line), the channel region 66 in contact with both the drain region 62 and the source region 64, the gate electrode 68 and the portion of the charge storage film 67 that is situated between the gate electrode 68 and the channel region 66. Each storage transistor 60 is isolated from adjacent storage transistors along an active stack (in the Z-direction) by the isolation dielectric layer 55. As thus configured, along each active strip (in the Y-direction), the storage transistors that share the common source line and the common bit line form a NOR memory string (referred herein as a "Horizontal NOR memory string" or "HNOR memory string").

Figure 4B:
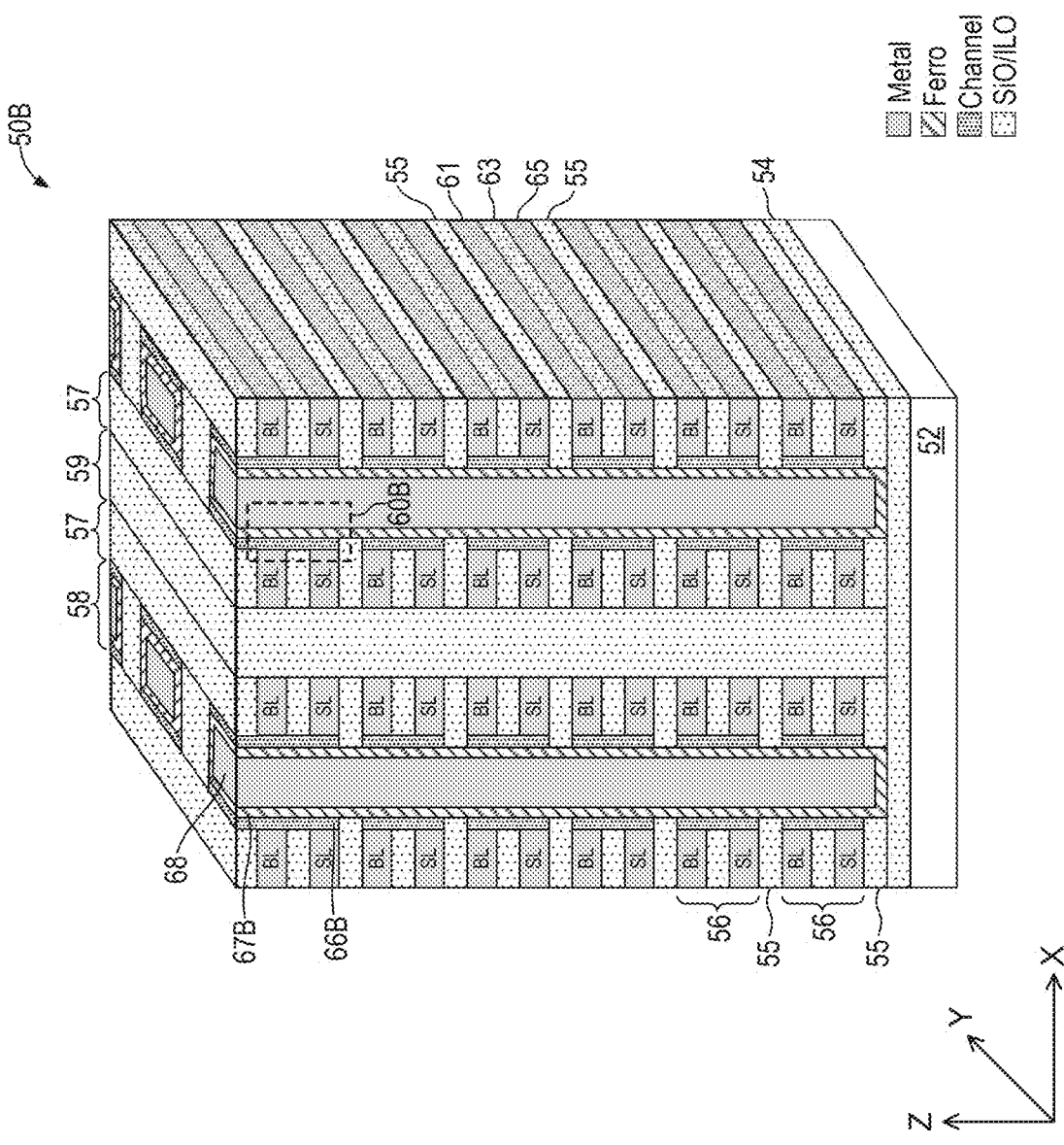
FIG. 4(b) illustrates a memory structure including a three-dimensional array of NOR memory string in some examples.

In alternate embodiments, the storage transistors in the three-dimensional memory array are junctionless ferroelectric storage transistors. In some embodiments, a ferroelectric storage transistor is constructed in a similar manner as the charge-trapping type storage transistors by replacing the charge storage films with a ferroelectric gate dielectric layer incorporating a ferroelectric material. FIG. 4(b) illustrates a memory structure including a three-dimensional array of NOR memory string in some examples. More specifically, FIG. 4(b) illustrates an exemplary three-dimensional memory array of junctionless ferroelectric storage transistors. Like elements in FIGS. 4(a) and 4(b) are given like reference numerals and discussion may be omitted. Referring to FIG. 4(b), a memory structure 50B includes thin-film junctionless ferroelectric storage transistors 60B formed as NOR memory strings along a horizontal direction (the Y-direction) in multiple planes, each plane being formed by a set of active layers 56. Each active layer 56 includes first and second conductive layers 61, 63 (e.g., titanium nitride (TiN)-lined tungsten (W)) separated by a dielectric layer 63 (e.g., silicon oxide). The first and second conductive layers 61, 65 for the drain and source terminals of the ferroelectric storage transistors. Subsequent processing steps form the channel regions 66B (e.g., an oxide semiconductor material, such as IGZO), the ferroelectric dielectric layer 67B, and the gate conductors or gate electrodes 68 (e.g., TiN-lined W) in narrow trenches between the separated active stacks. The gate electrodes 68 and the ferroelectric dielectric layer 67B are formed as columnar structures extending in the Z-direction. In the present description, the gate electrodes 68 are also referred to as "local word lines" and a gate electrode 68 enclosed by the ferroelectric dielectric layer 67B is collectively referred to as a local word line structure 58.

In the embodiment illustrated in FIG. 4(b), the storage transistors in the three-dimensional memory array are junctionless ferroelectric storage transistors. In some embodiments, the ferroelectric gate dielectric layer 67B is a doped hafnium oxide ($HfO_2$) layer. In one example, the hafnium oxide is doped with zirconium oxide ($ZrO_2$) to form a hafnium zirconium oxide layer (HZO). In another example, the hafnium oxide is doped with silicon (Si), iridium (Ir) and lanthanum (La). In some embodiments, the gate dielectric layer may further include an interfacial layer, such as a material with a high permittivity, between the channel region and the gate dielectric layer.

The first and second conductive layers of each active strip form a source line ("common source line") and a drain line ("common bit line") of the storage transistors which may be formed along one or both sides of the active strip 57. In the example shown in FIG. 4(*b*), storage transistors are only formed on one side of the active strip 57, with the other side of the active strip bordering an auxiliary trench 59. The auxiliary trench 59 does not include any active transistor devices. The ferroelectric storage transistor 60B is formed at the intersection of an active strip 57 with the channel region 66B and an LWL structure 58. As thus configured, along each active strip (in the Y-direction), the storage transistors that share the common source line and the common bit line form a NOR memory string or HNOR memory string. In some examples, three-dimensional arrays of NOR memory strings of thin-film junctionless ferroelectric transistors have been disclosed in U.S. patent application Ser. No. 17/936, 320, entitled "Memory Structure Including Three-Dimensional NOR Memory Strings of Junctionless Ferroelectric Memory Transistors and Method of Fabrication," of Eli Harari, filed on Sep. 28, 2022, which application is incorporated herein by reference in its entirety. The memory structure 50B of FIG. 4(*b*) can be constructed based on the memory structures described in the '320 patent application.

Referring to both FIGS. 4(*a*) and 4(*b*), to complete the memory circuit, various types of circuits are formed in or at the surface of the semiconductor substrate 52 to support the operations of the NOR memory strings. As described above, the support circuits for storage transistors in a tile are formed localized under the respective tile and are referred to as "circuit under array" or CuA. The circuits in the CuA may include power supplies, sense amplifiers, data latches, logic circuits and analog circuits, as described above. In embodiments of the present disclosure, the CuA includes a state machine or sequencer to control and implement memory operations at the storage transistors in each tile. By incorporating a state machine in each CuA, multiple tiles in a memory die can be accessed for concurrent memory operations.

In one exemplary embodiment, each tile in a memory die includes 8 active layers, that is, 8 layers of storage transistors. Each active layer includes 2 k bit lines (or 2*k* active stacks) with storage transistors formed on both sides of the bit lines and each tile includes 4 k word lines (gate electrodes), for a total of 8M bits per layer and 64M bits or 64M storage transistors in one tile.

In some embodiments, memory operations on the memory die are carried out in units of a memory page of memory data, also referred to as an access unit of memory data. Each memory access operates on one memory page in a memory bank (or tile) in the present embodiment. More specifically, the bit lines of the storage transistors in a memory page are selected at the same time and the storage transistors are sensed simultaneously to provide read data or the storage transistors are driven in the same write operation to store write data. In one example, a memory page of memory data is 512 bits. Accordingly, each time a read or write operation is performed, 512 storage transistors are accessed within a tile. In one embodiment, each memory access activates one word line (WL) which is associated with 32 memory pages and one of the 32 memory pages is selected for memory operation by selecting the bit lines associated with the storage transistors in the selected memory page.

In embodiments of the present disclosure, the support circuits (CuA) for each tile include the same number of sense amplifiers as the number of data bits in a memory page. Accordingly, in each read operation, all of the sense amplifiers are used for reading out stored data from the selected bit lines and no additional address bit for selecting a subset of the sense amplifiers is needed. Similarly, for the write operation, all of the sense amplifiers are used to drive the write data onto the selected bit lines and no additional address bit is needed to select the sense amplifiers. This is in contrast to traditional memory devices where one or more column address bits are needed to select a subset of sense amplifier to provide the read data. By providing the same number of sense amplifiers in the CuA as the number data bits in the memory page, the size of the CuA can be kept small to allow the CuA to be formed under each tile. Meanwhile, the memory operation is simplified by eliminating the address bit needed to select a subset of sense amplifiers. In some embodiments, the support circuits may include additional sense amplifiers for sensing or driving additional bit lines relating to other data to be stored in the memory array, such as refresh pointer data, meta data or memory health indicator bits.

In one embodiment, the interconnect structures 45 (FIG. 3) for each memory channel include connect structures for at least the number of data bits in a memory page. In one example, each set of the interconnect structures 45 includes 300 TSVs for each memory channel for outputting 512 data bits in a memory page over two clock cycles (256 bits each clock cycle) and additional data bits for error correction and control signals.

In the present description, the memory structure 50 of FIG. 4(*a*) includes storage transistors that implement charge trapping as the data storage mechanism and the memory structure 50B in FIG. 4(*b*) includes storage transistors that implement ferroelectricity as the data storage mechanism. The exact nature of the data storage mechanism being implemented in the memory structure of the present invention is not critical to the practice of the present invention. The biasing conditions applied to the storage transistors for read and write operations are a function of the data storage mechanism being implemented, as is understood by one skilled in the arts. For illustrative purposes, the biasing conditions for ferroelectric storage transistors will be used in the following description.

Figure 5:
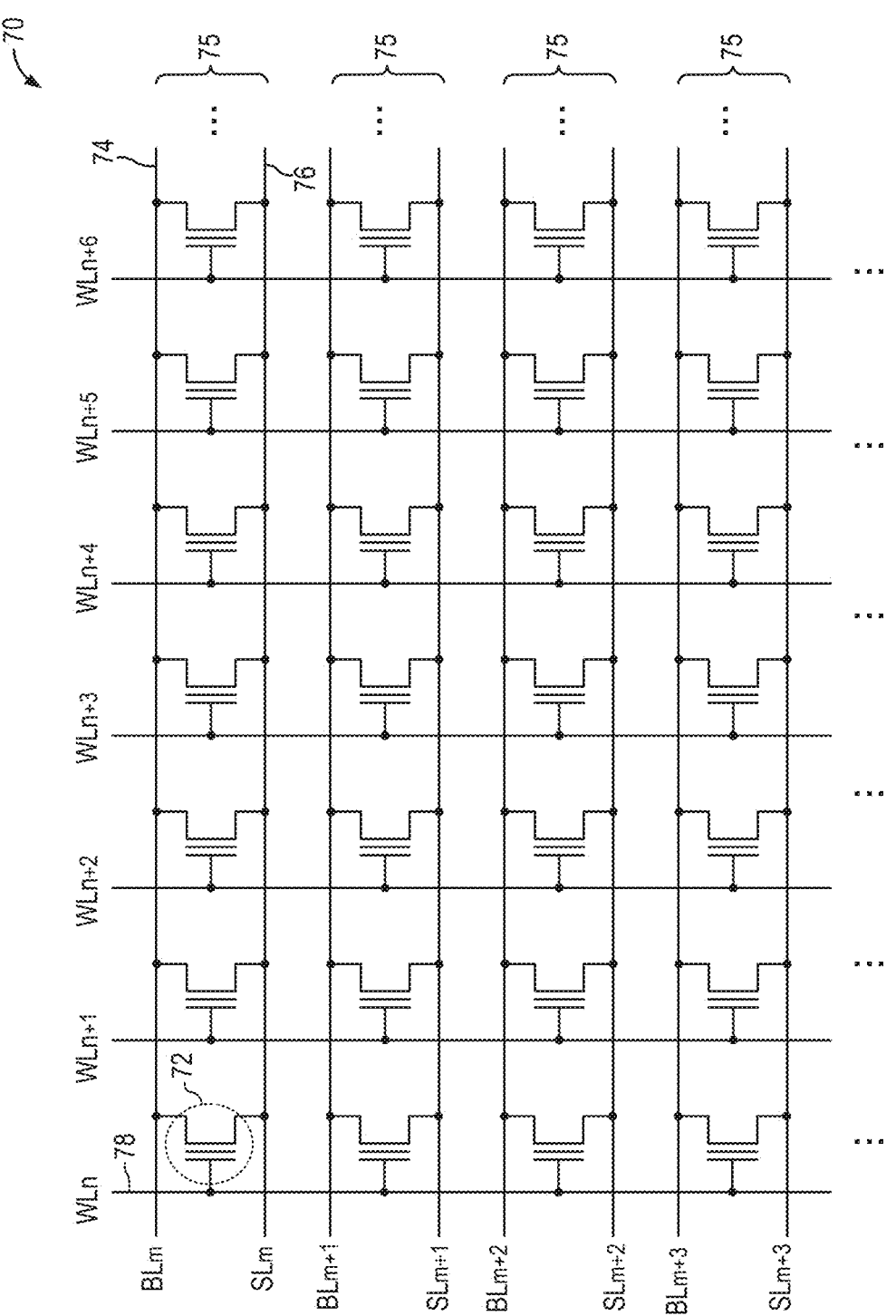
FIG. 5 is a circuit diagram illustrating a memory array of NOR memory strings in embodiments of the present disclosure.

FIG. 5 is a circuit diagram illustrating a memory array of NOR memory strings in embodiments of the present disclosure. FIG. 5 illustrates a memory circuit of NOR memory strings that can be formed by the memory structure of FIG. 4(*a*) or 4(*b*). Referring to FIG. 5, a memory array 70 of storage transistors 72 is illustrated and represents a portion of the storage transistors in the 3-D memory array of FIG. 4(*a*) or 4(*b*). The memory array 70 includes multiple memory strings 75 formed on each active layer, each memory string 75 includes a series of storage transistors 72 connected in parallel with each other between a common bit line 74 and a common source line 76. The memory string 75 is sometimes referred to as a NOR memory string as the storage transistors are connected in parallel with each other in a NOR configuration. The NOR memory string 75 of storage transistors forms a basic building block from which a two-dimensional or three-dimensional array of storage transistors can be formed. That is, multiple strings of storage transistors can be used to form a two-dimensional array of storage transistors, or a plane of storage transistors. A three-dimensional array of storage transistors can be formed by stacking multiple planes of the two-dimensional array of storage transistors. In the present description, the semiconductor memory device is implemented by an array or arrays of strings of storage transistors and the exact configuration or arrangement of the strings of storage transistors is not critical to the practice of the present invention.

Each storage transistor 72 is a thin-film storage transistor including a drain terminal connected to the bit line 74, a source terminal connected to the source line 76, a gate terminal or control terminal connected to a word line 78 and a data storage film in which data is stored for the storage transistor. For example, the data storage film can be a set of charge storage films or a ferroelectric dielectric layer. More specifically, the gate terminals of the storage transistors 72 are driven by respective word lines (WLx) 78 where each word line WLx activates one storage transistor 72 in one NOR memory string 75, while simultaneously activating other storage transistors in other NOR memory strings. As thus configured, when a word line WL is selected, all of the storage transistors 72 that are connected to the same word line (e.g. WLn) are activated. In operation, a selected word line activates P number of memory pages, each memory page including Q number of storage transistors associated with Q number of NOR memory strings. The bit lines belonging to the selected memory page are selected for memory operation. Accordingly, a memory page is selected by a selected word line and selected bit lines to access Q number of storage transistors in the selected memory page.

For example, the bit line of each memory string is coupled to a sense amplifier circuit to sense the stored data in the memory read operation. The sense amplifier circuit and other circuit elements as well as the control signals for facilitating the operation of the sense amplifier and the memory array are not shown in FIG. 5. For example, the bit line may include a discharge transistor to discharge the bit line after a read or write operation. In another example, the sense amplifier circuit may include transistors and devices to implement sense amplifier reset functions. Furthermore, the sense amplifier circuit may include a latch circuit for latching the output of the sense amplifier. An exemplary sense amplifier circuit will be described in more details below with reference to FIG. 6.

In embodiments of the present disclosure, the memory device incudes storage transistors (or "memory cells") that can be read, programmed or erased. The program and erase operations are sometimes collectively referred to as a write operation. The memory device implements memory operations including a read operation to read data from the storage transistors and a write operation to write data into the storage transistors. The memory device may implement other operations, such as a refresh operation, which will not be described in the present description. In the present description, the write operation includes two operations or two phases—the erase operation or the erase phase and the program operation or the program phase. In the present embodiment, the erase operation is associated with writing a first logical state (e.g. logical "1") into a memory cell and the program operation is associated with writing a second logical state (e.g. logical "0") into the memory cell. It is instructive to note that the specific logical state assigned to the erase or program operation is arbitrary and not critical to the practice of the present invention. In other embodiments, the erase step can be associated with writing a logical "0" into a memory cell and the program step is associated with writing a logical "1" into the memory cell. In the present embodiment, the erase operation can be referred to as a Set 1 operation and the program operation can be referred to as a Set 0 operation.

In the memory array 70, each storage transistor of a NOR memory string is read, programmed or erased by suitably biasing its associated word line 78 (WLx) and the common bit line 74 (BLy) it shares with other storage transistors in the NOR memory string 75. The storage transistor's associated word line is shared with storage transistors of NOR memory strings on other planes that are aligned with the storage transistor along the direction normal to the planar surface of the semiconductor substrate ("vertical direction"). Each word line may also be shared between two storage transistors from neighboring NOR memory strings on the same plane (see FIGS. 4(a) and 4(b)). In some embodiments, the common source line is normally electrically floating, that is, not connected to any electrical potential. During read, program or erase operation, the common source line of the NOR memory string is typically provided a relatively constant voltage that is maintained either by a voltage source or by the charge in an associated capacitor ("virtual ground"), such as the parasitic capacitance of the common source line. For example, the common source line of the NOR memory string can be biased to a given voltage by a precharge operation where the desired voltage is provided on the common bit line and the common source line is charged to the voltage on the bit line through one or more precharge transistors. To program or erase the storage transistor, for example, a substantial voltage difference (e.g., 8 volts for charge storage type storage transistor and 3V for ferroelectric storage transistor) is imposed across the common bit line and the word line. To mitigate disturb to a non-selected storage transistor, a predetermine voltage difference that is significantly less than the required voltage to program or erase may be imposed across the non-selected storage transistor's associated word line and its common bit line, so as to inhibit undesired erasing or programming of the non-selected storage transistor.

Figure 6:
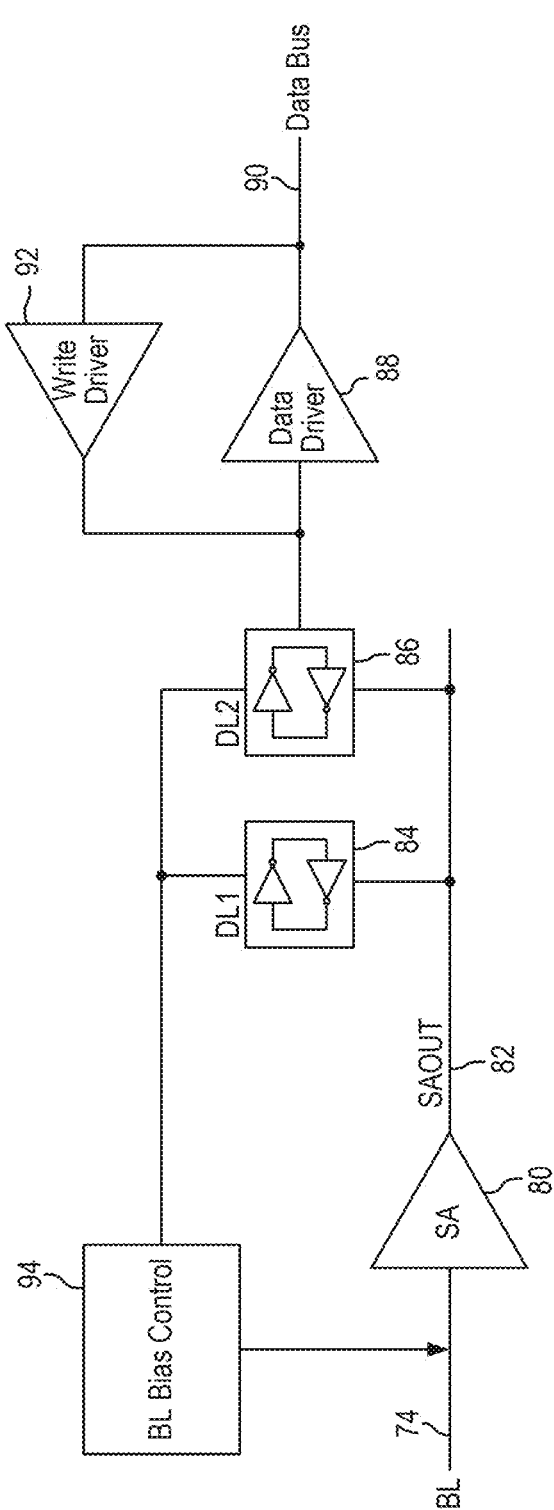
FIG. 6 is a circuit diagram illustrating an exemplary support circuits connected to the bit line of the NOR memory string in embodiments of the present disclosure.

FIG. 6 is a circuit diagram illustrating an exemplary support circuits connected to the bit line of the NOR memory string in embodiments of the present disclosure. In particular, FIG. 6 illustrates the sense amplifier circuit and related circuit elements for performing read and write memory operations. Additional circuit elements and control signals are omitted to simplify the discussion. Referring to FIG. 6, each bit line 74 is connected to a sense amplifier 80 through a bit line selector (not shown). In actual implementation, each bit line selector is connected to P number of bits lines to select one out of P number of bit lines for sensing at the associated sense amplifier. In other words, each bit line selector is connected to the bit line of same data bit across P number of memory pages. In the case an access unit includes 512 bits of memory data, 512 bit line selectors are provided to select the bit lines of the selected memory page for access. As thus constructed, a selected word line activates P number of memory pages (such as 32 memory pages) and the set of bit line selectors at each sense amplifier selects the bit lines associated with the selected memory page for access. FIG. 6 illustrates a selected bit line 74 connected to the sense amplifier 80. The bit line selector and other bit lines that share the same sense amplifier are omitted in FIG. 6 for simplicity.

In a read operation, the sense amplifier 80 senses a voltage signal indicative of the bit line current on the selected bit line to determine a logical state of the selected storage transistor and generates a sense amplifier output SAOUT (node 82) in response to the sensing. In the present embodiment, the sense amplifier output SAOUT (node 82) is coupled to a pair of data latches 84, 86. In the present embodiment, the first data latch 84 (DL1) may be used to store data locally to the memory tile, such as read data for refresh operation, and the second data latch 86 (DL2) may be used to store data to be exchanged with the memory controller, such as read data retrieved from the selected storage transistor or write data received from the memory controller. It is instructive to note that the sense amplifier circuit configuration including two data latches 84, 86 is illustrative only and not intended to be limiting. Other sense amplifier circuit configuration are possible. In one embodiment, the sense amplifier itself may be configured to incorporate data latching capability so that the sense amplifier 80 can itself function as a data latch to store read data. In that case, the support circuits for each tile incudes three data latches, DL1, DL2 and the sense amplifier as the third data latch DL3. In that case, the third data latch DL3 (the sense amplifier) may be used to store the read data retrieved from the selected storage transistor and the second data latch DL2 is used to store the write data received from the memory controller.

In a read operation, the sense amplifier 80 senses the voltage signal on the selected bit line 74 which is indicative of the bit line current associated with the erased or programmed state of the selected storage transistor. The sense amplifier 80 generates the sense amplifier output signal SAOUT having a logical state indicative of the sensed bit line voltage signal. In one embodiment, in the read operation, the read data is stored in the data latch DL2. The read data is driven onto the data bus 90 by a data driver 88 to be provided to the memory controller. In practice, the data driver 88 may be controlled by a clock signal to drive the read data onto the data bus 90 synchronized with the clock signal.

In a write operation, the write data from the memory controller is provided to the data bus 90 and a write driver 92 drives the write data to the data latch DL2. The write driver may also be controlled by a clock signal to drive the write data into the data latch DL2 in response to the clock signal. To perform the erase or program operation, a bit line bias control circuit 94, under control of the state machine in the CuA, drives the bit line 74 to program or erase voltages according to the logical state of the write data to be written to the storage transistor.

Memory Controller Architecture

Figure 7:
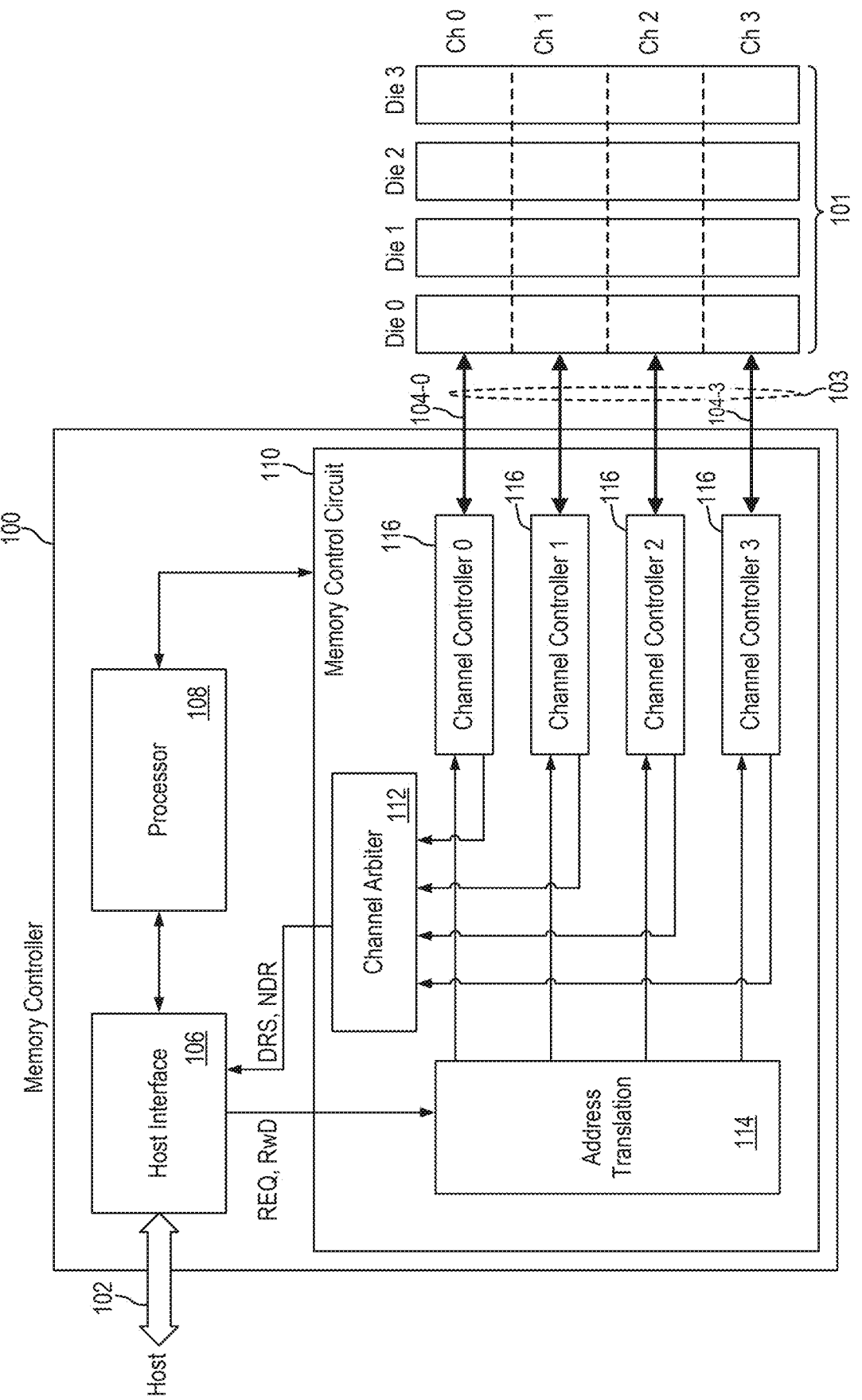
FIG. 7 is a schematic diagram of a memory controller in embodiments of the present disclosure.

FIG. 7 is a schematic diagram of a memory controller in embodiments of the present disclosure. The memory controller 100 of FIG. 7 may be used to implement the memory controller 14 in memory module 30 of FIG. 2(*a*) in some examples. In particular, the memory controller 100 is configured to operate memory devices configured with multiple independently accessed memory channels. Referring to FIG. 7, the memory controller 100 includes a host interface circuit 106 for interfacing with a host, a memory control circuit 110 for interfacing with a memory device 101, and a processor 108 controlling the operation of the host interface circuit 106 and the memory control circuit 110. The memory controller 100 operates based on one or more clock signals. For example, the host interface circuit 106 may use a clock signal at a first clock frequency while the memory control circuit 110 and the processor 108 may use a clock signal at a second clock frequency, different from the first clock frequency. Clock signals for operating the memory controller are not shown in FIG. 7 to simplify the discussion but it is understood that the memory controller 100 operates based on one or more clock signals.

The host interface circuit 106 is coupled to a host interface bus 102 for communicating with a host, such as a host processor. The memory controller 100, through the host interface circuit 106, receives requests from the host processor and transmit responses to the host processor. For example, the memory controller 100 receives read requests and write requests with write data from the host over the host interface bus 102. The memory controller 100 provides read data and write completion responses to the host over the host interface bus 102. In one exemplary embodiment, the host interface circuit 106 communicates with the host over a PCIe 5.0 serial bus using the CXL (Compute Express Link™) protocol. Under the CXL protocol, the host processor issues requests without data (REQ) as the read requests and requests with data (RwD) as the write requests with write data. Furthermore, under the CXL protocol, the memory controller 100 issues responses with data (DRS) as the read data and responses without data (NDR) as the write completion response.

The memory control circuit 110 is configured to operate on memory channels of a memory device 101 and communicate with the memory device over a memory array interface 103. In embodiments of the present disclosure, the memory device 101 is a memory stack including multiple memory dies formed stacked one on top of another. In the present example, the memory stack 101 includes four memory dies—Die 0, Die 1, Die 2 and Die 3. The memory dies in the memory stack 101 are partitioned in accordance with the memory channel configuration scheme described above into N number of independently accessible memory channels. In the present example, the memory dies—Die 0, Die 1, Die 2 and Die 3—are partitioned into 4 memory channels—Ch 0, Ch 1, Ch 2 and Ch 3. In other examples, the memory dies may be partitioned into 8 channels or 16 channels. Under the memory channel configuration scheme in exemplary embodiments of the present disclosure, each memory channel Ch n is formed across all of the semiconductor dies in the memory stack 101. That is, each of memory channel Ch 0 to Ch 3 includes memory partitions from memory dies Die 0 to Die 3. The memory control circuit 110 communicates with the memory stack 101 over the memory array interface 103 which includes individual memory channel interfaces 104-0 to 104-3 for each respective memory channel Ch 0 to Ch 3. In particular, each memory channel interface 104-*n* includes data and command interfaces for the respective memory channel.

The configuration of the memory device 101 in FIG. 7 is illustrative only and not intended to be limiting. The memory control circuit 110 is configured to operate a memory device in any configuration, such as a single semiconductor memory die or multiple semiconductor dies. The memory control circuit 110 is configured to operate on the memory channels of a memory device where memory channels may be configured in many ways. The exact channel configuration of the memory device is not critical to the practice of the present invention. In FIG. 7, the memory device is a memory stack and the channel configuration is across the memory dies in the stack. In another example, the memory device may include multiple memory dies (e.g. k memory dies) arranged in a planar fashion adjacent the memory controller, where each memory die includes multiple memory channels (e.g. n memory channels). The memory control circuit 110 of the memory controller 100 can be configured to operate the k*n memory channels across the k memory dies.

The memory control circuit 110 includes a channel controller 116 that is instantiated N times to provide one channel controller 116 for each memory channel. In the present example, 4 instances of the channel controller 116 are provided, including Channel Controller 0 to Channel Controller 3, for the four memory channels of the memory stack 101. Each channel controller 116 communicates with a memory channel over the respective memory channel interface 104-*n*. In this manner, each memory channel Ch 0 to Ch 3 of the memory stack 101 is independently accessible and the memory channels Ch 0 to Ch3 can be accessed in parallel to realize high bandwidth memory access.

The memory control circuit 110 further includes an address translation circuit 114 and a channel arbiter 112, both communicating with all of the channel controllers 116. The host interface 106 receives incoming requests from the host and the incoming requests, such as read requests (REQ) or write requests (RwD), are provided to the address translation circuit 114 of the memory control circuit 110. The address translation circuit 114 decodes the logical address in each request to determine which of the memory channels the request should be sent and transmits the requests to the channel controller 116 of the designated memory channel. On completion of a memory operation, each channel controller 116 provides responses, such as the read data or the write completion response, to the channel arbiter 112. The channel arbiter 112, under the control of channel arbitration logic, selects the responses to be transmitted to the host interface 106. For example, the channel arbitration logic may return responses in the same order as the corresponding requests being received. In another example, the channel arbitration logic may implement a credit management scheme to determine which response from which memory channel is to be returned to the host processor. In some examples, the channel arbitration logic may be implemented in the processor 108.

Figure 8:
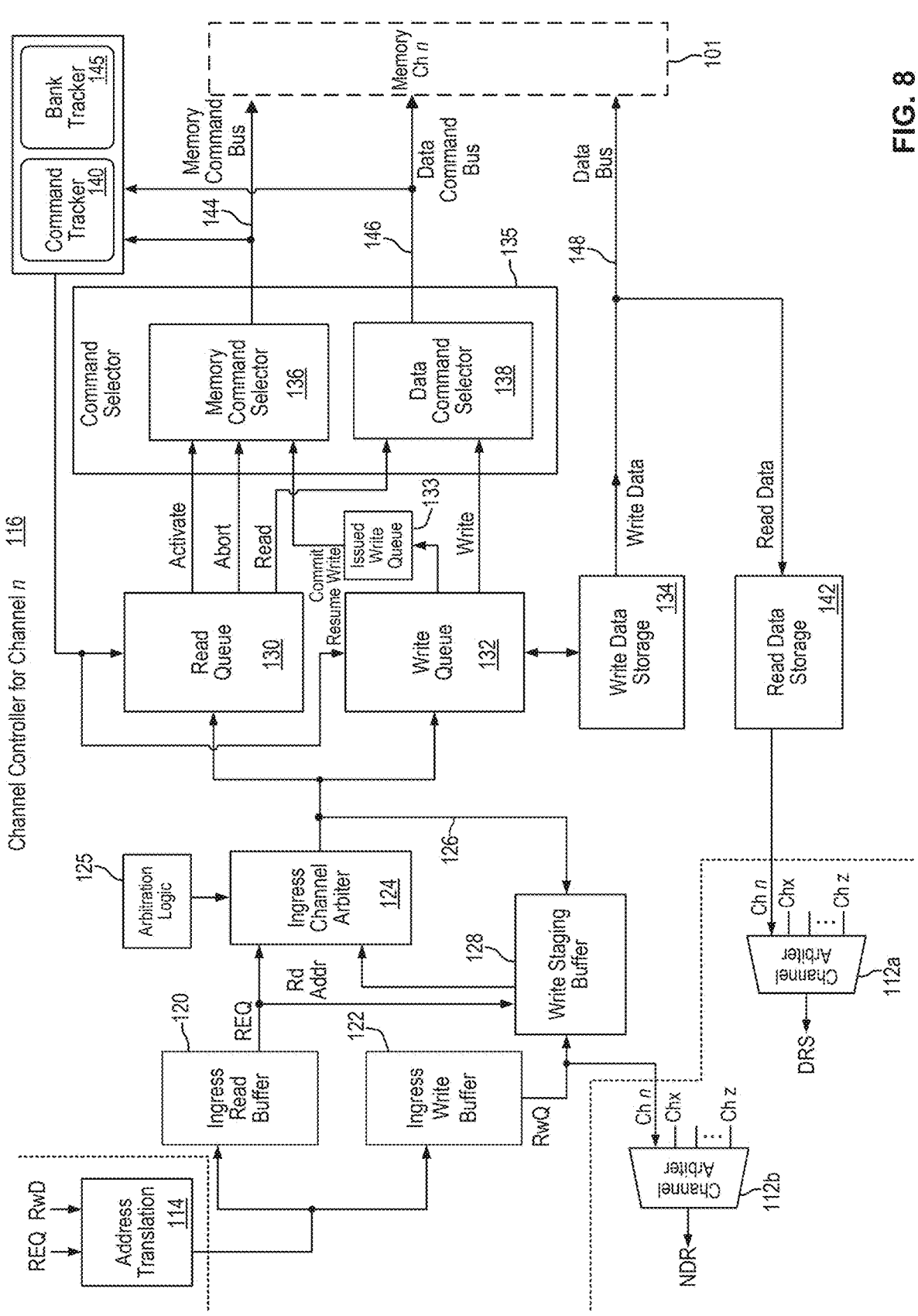
FIG. 8 is a schematic diagram of a channel controller which can be implemented in the memory controller of FIG. 7 in embodiments of the present disclosure.

FIG. 8 is a schematic diagram of a channel controller which can be implemented in the memory controller of FIG. 7 in embodiments of the present disclosure. As described above with reference to FIG. 7, the memory controller 100 receives incoming requests on the host interface bus 102 and the requests are provided to the address translation circuit 114 of the memory control circuit 110. The address translation circuit 114 decodes the logical address in the request to generate the physical address of the memory device 101 associated with the logical address. In the present description, the physical address is also referred to as the memory address. Based on the channel address indicated in the decoded physical address, the requests are provided to the respective channel controller 116. In some embodiments, the address bits for selecting the memory channel is the lower order address bits of the physical address. In this manner, the incoming requests are distributed over the different memory channels, reducing channel conflicts and increasing memory utilization. As a result of the address translation, each channel controller 116 receives incoming requests for read or write operation that are designated for its memory channel.

It is instructive to note that the operation of the channel controller 116 is based on one or more clock signals. Typically, the channel controller 116 operates based on a controller clock signal at a given clock frequency. Signals transmitted into and out of the channel controller may cross over different clock domains (that is, different clock frequencies). In that case, buffers or clock crossing FIFO circuits may be used for signals crossing over two different clock frequencies. In the present description, clock signals and related clock crossing circuits are not shown in FIG. 8 to simplify the discussion. It is understood that the operation of the channel controller is synchronized to the controller clock signal. For instance, the channel controller 116 sends commands to the memory device 101 at each clock cycle of the controller clock signal. In one example, the controller clock signal has a frequency of 500 MHz and the channel controller sends a command to the memory device every clock cycle or every two clock cycles, that is, every 2 ns or every 4 ns, a command is sent to the memory device where there is a command available.

In some embodiments, the address translation circuit 114 decodes the logical address in the request to a physical address which includes the memory channel address, the memory bank address, the memory die address, the word line address and the memory page address. The decoded physical address therefore selects a memory channel out of the N memory channels and selects a memory die out of the K number of memory dies in the selected memory channel. The physical address further selects a memory bank (or a memory tile) within the selected memory die of the selected memory channel. In the selected memory bank, the physical address selects a word line, which activates P number of memory pages in the memory tile. The physical address finally selects one memory page out of the P memory pages associated with the selected word line. As described above, each memory page includes Q number of data bits, such as 512 bits.

Referring to FIG. 8, the channel controller 116 receives incoming read or write requests from the address translation circuit 114 and stores the requests into separate ingress buffers. In particular, incoming read requests are stored in an ingress read buffer 120 and incoming write requests are stored in an ingress write buffer 122. The incoming write requests are then provided to and stored in a write staging buffer 128 as pending write requests. An ingress channel arbiter 124 regulates the flow of the pending read and write requests to a read queue 130 and a write queue 132, based on one or more predetermined priority rules provided by a read/write arbitration logic circuit 125. In particular, the ingress channel arbiter 124 arbitrates the pending read requests from the read ingress buffer 120 and the evicted pending write requests from the write staging buffer 128 to select requests to send to the read and write queues 130 and 132, based on the predetermined priority rules. For example, the ingress channel arbiter 124 may give priority to read requests unless the write staging buffer is almost full for one or more memory banks. The ingress channel arbiter 124 may further consider attributes such as the age of a request or the memory bank status in the priority determinations. In another example, the ingress channel arbiter 124 forwards read requests to the read queue or forwards write requests to the write queue in a manner to avoid excessive bank conflicts.

The read queue 130 and write queue 132 store the read and write requests and generate commands for the memory device 101 based on the requests. The read queue 130 and the write queue 132 generate commands which bid for access to the memory device 101 through a command selector 135, sometimes referred to as a global arbitration circuit or a global scheduler. The command selector 135 selects the commands to be sent to the associated memory channel of the memory device 101 to perform the memory operation at the destination memory address associated with each respective request. The command selected by the command selector 135 is sometimes referred to as a "winning command."

In embodiments of the present disclosure, the channel controller 116 of FIG. 8 is adapted for a memory device where the write latency is much longer than the read latency. A salient feature of the channel controller of the present invention is that the channel controller is configured to mask what may be a long write latency from the host. In some embodiments, the channel controller 116 stores the incoming write requests and write data in the write staging buffer 128 and returns the write completion responses to the host prior to the write operation actually being performed at the memory device, that is, prior to the write data being stored onto the memory device. Meanwhile, the channel controller 116 manages the write requests and performs the write operation to the memory device in the background of the host operation so that any extended write latency at the memory device is hidden from the host system and the host system can operate as if there is only a nominal write latency at the memory device.

In some embodiments, in the channel controller 116, each write request stored in the ingress write buffer 122 is first evicted to the write staging buffer 128 and the pending write request entries in the write staging buffer 128 are then provided to the ingress channel arbiter 124 for arbitration with the read requests from the read ingress buffer 120. In one example, the write staging buffer 128 can be used to prevent too many write requests to the same memory bank of the memory channel from being sent to the write queue 132 which may fill up the write queue and causing backpressure to the ingress write buffer 122. In some embodiments, the write staging buffer 128 is sized to store a large number of write requests, sufficient to handle the write latency of the memory device being masked from the host. In the present embodiment, eviction of a write request from the ingress write buffer 122 to the write staging buffer 128 signals a write completion response to the host. That is, whenever a write request is evicted or removed from the ingress write buffer 122 and transferred to the write staging buffer 128, a write completion response for that write request is sent out to the host. From the host's perspective, that particular write request is completed while the channel controller 116 maintains and handles the write request to be completed at the memory device 101. In the present example, the write completion response (e.g. an NDR under the CXL protocol) for the respective memory channel n is provided to the channel arbiter 112*b*, which receives the write completion responses from all of the memory channels (e.g. Ch n, x to z). The channel arbiter 112*b* selects, based on predetermined arbitration rules, the write completion response from the memory channels to be provided to the host, through the host interface.

As described above, the ingress channel arbiter 124 arbitrates the read requests from the ingress read buffer 120 and the write requests from the write staging buffer 128 to select requests to send to the read and write queues, based on predetermined priority rules. In another example, the ingress channel arbiter 124 forwards read requests to the read queue or forwards write requests to the write queue in a manner to avoid excessive bank conflicts. For example, if there is a write request pending for a given memory bank of a given memory die in the write queue, the ingress channel arbiter 124 does not forward additional write requests to the same memory bank of the same memory die to the write queue but will forward write requests destined for other memory banks to the write queue instead. In this manner, the ingress channel arbiter 124 avoids sending excessive number of write requests to the same memory bank of the same memory die to the write queue 132 which may cause the write queue to fill up in the case the memory device has a long write latency.

In embodiments of the present disclosure, the ingress channel arbiter 124 further evaluates the incoming read requests to determine if a read request is for the same memory address as a write request that is pending in the write staging buffer 128. In embodiments of the present disclosure, the read ingress buffer 120 forwards the memory address of the pending read requests ("read address") to the write staging buffer 128. The write staging buffer 128 determines if the read request is for the same memory address as a pending write request in the write staging buffer 128. In the event the write staging buffer 128 determines a read request has a memory address that matches the destination memory address of a pending write request in the write staging buffer, the channel controller 116 may implement various techniques to provide the write data of the matching pending write request as the read data of the read request. In one example, the read request may be satisfied by the write data from the write staging buffer 128. In another example, the channel controller 116 may forward the matching pending write request to the write queue 132 and the read request may be satisfied by the write data from the write queue 132 (or more specifically, the write data storage 134 associated with the write queue).

In the present embodiment, the read queue 130 is a data structure that stores the pending read requests for the associated memory channel. The read queue 130 stores the pending read requests with the destination memory address, such as the memory bank address and the memory page address for each read request. The read queue 130 further stores for each read request other attributes associated with the read request, such as the status of the memory bank indicated by the destination memory address and the command being processed at the memory bank, if any. The memory bank status ("bank status") is used to indicate whether the read request is eligible to be sent to the memory device. In the present embodiment, each entry in the read queue 130 can request to send an Activate command, a Read command, or an Abort command. The Activate command instructs the memory device to start sensing the stored data in the designated memory page of the designated memory bank using the sense amplifier circuits and to store the sensed data in a data latch coupled to the sense amplifier circuit (such as data latch DL2 in FIG. 6). The Read command outputs the sensed data stored in the data latch to the channel controller 116. For instance, the read data is read out of the memory device 100 and stored in a read data storage 142. The Abort command will be explained in more details below.

In the present embodiment, the write queue 132 is a data structure that stores the active write requests for the associated memory channel. The write queue 132 stores the active write requests with the destination memory address, such as the memory bank address and the memory page address for each write request. In the present embodiment, the write data for each write request is stored in a write data storage 134 in communication with the write queue 132. The write queue 132 further stores for each write request other attributes associated with the write request, such as the status of the memory bank indicated by the destination memory address and the command being processed at the memory bank, if any. The memory bank status ("bank status") is used to indicate whether the write request is eligible to be sent to the memory device. In the present embodiment, each entry in the write queue 131 can request to send a Write command. The Write command is sent to the memory device with the accompanying write data stored in the write data storage 134 to instruct the memory device to write the data into the designated memory page of the designated memory bank. In some embodiments, the write data is first stored into the data latches (such as data latch DL2 in FIG. 6) and the bit line bias control circuit drives the write data into the storage transistors.

In the present embodiment, the channel controller 116 includes an issued write queue 133. The write queue 132 allocates an active write request entry to the issued write queue 133 when the active write request is the winning command at the command selector 135. In particular, the write queue 132 sends the Write command with the write data to the memory device 101 in response to an active write request being selected by the command selector 135. For example, the write data is sent to the memory device 101 and is stored in the data latches (e.g. data latch DL2) of the designated memory page. The write queue 132 then transfers the write request to the issued write queue 133. The issued write queue 133 handles the remaining write operation flow. For example, each entry in the issued write queue 133 can send a Commit command to instruct the memory device 101 to initiate the bias voltage sequence to write the previously sent write data into the storage transistors at the destination memory address. For instance, the Commit command is sent to activate the program, erase or refresh operation flows at the support circuit (CuA) of the designated memory tile which drives the appropriate voltages onto the bit lines of the storage transistors associated with the selected memory page. The issued write queue 133 may deallocate a write request when the write flow is done, that is the erase and program operation at the storage transistors have been completed. Furthermore, in the present embodiment, each entry in the issue write queue 133 can also send a Resume Write command, which will be explained in more details below.

In some embodiments, the issued write queue 133 stores the issued write requests until completion. It is instructive to note that the use of the issued write queue 133 is optional and may be omitted in other embodiments. In other embodiments, issued write requests may be stored in the write queue 132 itself until completion of the write request.

In the present embodiment, an active read or write request in the respective read/write queue is eligible for bidding access when the memory bank it is destined for does not currently have a memory operation being performed. For example, a read or write request is eligible when the memory bank it is destined for is not currently being read from, or written to. Eligible read or write requests bid for access to the memory device 101 through the command selector 135. The command selector 135 arbitrates the commands received from eligible read or write requests to determine the command ("the winning command") to send to the memory device 101 at each clock cycle (or each x number of clock cycles).

In embodiments of the present disclosure, the command selector 135 selects the commands to send to the memory device 101 based on predefined priority rules. In the present embodiment, the command selector 135 transmits commands to the respective memory channel of the memory device over two command busses: (1) a memory command bus 144 for commands that do not involve data, such as the Activate command, the Abort command, the Commit command and the Resume Write command; and (2) a data command bus 146 for commands involving data, such as the Read command and the Write command. In some embodiments, the command selector 135 includes a memory command selector 136 and a data command selector 138 for selecting from eligible commands provided by the read queue 130 and write queues 132. The memory command selector 136 selects commands to be sent on the memory command bus 144 to the memory device, and the data command selector 138 selects commands to be sent on the data command bus 146 to the memory device. In the present embodiment, commands that are provided to the memory command selector 136 include, for example, the Activate command for setting up a read operation. The commands transmitted on the memory command bus 144 are not associated with any read or write data. Meanwhile, commands that are provided to the data command selector 138 include, for example, the Read command and the Write command. Synchronized to a write command being provided on the data command bus 146, the associated write data is provided on a data bus 148 from the write data storage 134. In response to the Read command, the memory device 101 provides the read data on the data bus 148 which is then stored in the read data storage 142. The read data is provided as the read data response for the memory channel.

In the present example, the read data response (e.g. DRS) for the respective memory channel n is provided to the channel arbiter 112a, which receives the read data response from all of the memory channels (e.g. Ch n, x to z). The channel arbiter 112a selects, based on predetermined arbitration rules, the read data response from the memory channels to be provided to the host, through the host interface.

In embodiments of the present disclosure, the channel controller 116 is configured to operate in a manner to maximize the performance of the memory device. For example, in one embodiment, the channel controller is configured to operate in a greedy mode wherein the channel controller always tries to send commands to the memory device for execution, as long as there are requests pending. Accordingly, the read queue 130 and the write queue 132 will always send eligible commands to the command selector 135 to bid for access to the memory device. Meanwhile, the command selector 135 operates based on predefined priority rules to select the winning command to send to the memory device each x clock cycle (x being 1 or more). In one example, the command selector 135 may be configured in a Read Priority mode where commands for write operations are sent in empty clock cycles between commands for read operations. In another example, the command selector 135 may be configured in a Write Priority mode where commands for read operations are sent in empty clock cycles between commands for write operations. In some embodiments, the predefined priority rules may include fixed priority rules or dynamic priority rules.

In operation, the read queue 130 and the write queue 132 store active read and write requests for the memory device, each read/write request being associated with a destination memory page in a destination memory bank of a destination memory die of the memory channel. The read queue 130 and write queue 132 determine which of the pending requests stored therein are eligible to be executed at the memory device. The read queue 130 and write queue 132 always try to send all eligible commands to the command selector 135. The command selector 135 arbitrates the commands using the predefined priority rules and selects a winning command at each clock cycle (or x clock cycles). The winning command will then be sent to the memory device 101 over the respective memory command bus 144 or data command bus 146 (with the write data on the data bus 148). To keep track of the memory operation being performed at the memory device, the winning command is provided to a command tracker 140 which operates to track the progress of each command sent to the memory device. The winning command is also provided to a bank tracker 145 which tracks the status of each memory bank in the memory channel. The read queue 130 and the write queue 132, as well as the issued write queue 133, use the information in the bank tracker 145 and the command tracker 140 to determine the status of each memory bank to which a request is pending and based on the bank status, determine commands that are eligible for bidding for access at the command selector 135.

In some embodiments, the bank tracker 145 is a data structure and stores banks status data for each memory bank in the memory channel where the bank status indicates whether a given memory bank is inactive (and thus eligible to receive commands) or is busy (thus not eligible to receive commands). The bank tracker may further store data indicating the memory operation being performed at a busy memory bank. The read queue 130 and the write queue 132 obtain the status of each memory bank associated with respective pending requests from the bank tracker 145.

In some embodiments, the command tracker 140 tracks each command sent and being executed at each memory bank of the memory device based on clock timing. In one embodiment, each command being executed at the memory device 101 is assigned a predetermined command execution time. The command tracker 140 tracks commands issued for execution at the memory device and indicates a given command is completed at the expiration of the predetermined command execution time assigned to that command. In some examples, the progress of each command being executed is tracked using clock cycles. In one example, the commands sent to the memory device 101 share the same time base, for example, a command is sent every 4 ns. In some embodiments, the command tracker 140 is implemented as a shift register. In one example, a winning command is allocated at the head of the shift register and is shifted every clock cycle so as to keep track of the progress of the command being executed at the memory device. In some embodiments, configurable tap points are provided in the shift register to indicate relevant timing restrictions. A command progressing through the shift register is compared with each tap point. A match at a tap point indicates that the time or clock cycles from the command being issue to the given tap point has passed. In this manner, the command tracker keeps track of the progress of each command issued to the memory device. A command that has progressed past the tap point associated with the assigned command execution time will be indicated as a completed command and the associated memory bank indicated as free.

As thus configured, the read queue 130 and the write queue 132 determine the bank status and the memory operation in progress at each memory bank in which a request is pending. The bank status and memory operation progress information allows the read queue and the write queue to determine whether a pending request is associated with a memory bank that is busy or a memory bank that is inactive or free. For pending requests associated with inactive memory banks, the read queue and the write queue issue eligible commands to bid for access. The memory command selector 136 and the data command selector 138 of the command selector 135 select the winning command among the eligible commands in each clock cycle to send to the memory device 101. The command tracker 140 and the bank tracker 145 update their respective status in response to the winning command at each clock cycle. In this manner, the winning command is identified to the read queue 130 and the write queue 132 and the bank status associated with the memory bank of the winning command is updated to busy. Any pending request to the same memory bank will now become ineligible for bidding.

In the present description, the structure and operation of the channel controller are described to illustrate the process flow from receiving incoming requests to generating commands for the memory device. It is understood that the channel controller may include other circuit elements not shown or described to support the memory operation. For example, the channel controller may implement error detection and correction and the channel controller may include an ECC encoder to perform error correction encoding and an ECC decoder to detect and correct for bit errors, thereby preventing data loss. ECC circuits and other support circuits that may be included in the channel controller are omitted in FIG. 8 to simplify the discussion.

In the above-described embodiments, the memory device is formed by a memory stack of K memory dies with memory channel partitions across the memory dies in the stack. In alternate embodiments of the present invention, the K memory dies of the memory device are placed side-by-side on an interconnect structure, such as an interposer, adjacent and close to the memory controller die, also formed on the same interconnect structure. Such a packaging configuration is sometimes referred to as 2.5D packaging. In some examples, when formed on an interposer, the interposer provides high density die-to-die connections between the K memory dies and the memory controller die. In some embodiments, each memory die is partitioned into S memory channels and the K memory dies together form S*K memory channels. As thus configured, the memory device provides a large number of memory channels which has the beneficial effect of reducing access conflicts and increasing the availability of memory banks in the K memory dies.

In the above-described embodiments, the memory device includes a memory stack of K memory dies formed stacked one on top of another, where the K memory dies provide the intended or designated memory capacity of the memory module. In embodiments of the present invention, the memory stack includes at least one additional spare memory die which is used to provide redundancy memory capacity in the memory module. In some embodiments, the spare memory die is formed as part of the memory stack and is coupled to the K memory dies through the same interconnect structures connecting the K memory dies, such as TSV.

Accordingly, in some embodiments, a memory module includes a memory device integrated with a memory controller where the memory device is formed by a memory stack including K+1 memory dies. As thus configured, preferably, the K memory dies provide the intended or designated memory capacity of the memory module and the additional one memory die (the "spare memory die") provides additional memory capacity for redundancy. As thus configured, the memory address space of the spare memory die is not known by the host processor and is only known by the memory controller. That is, the host processor is not aware of the physical presence of the spare memory die or the memory address space associated with the spare memory die. The host processor is only aware of the memory address space ("host address space") of the K memory dies. That is, incoming requests from the host processor to the memory module are directed only to the memory address space that spans the K memory dies as known to the host processor. Meanwhile, the memory controller controls the physical memory address space that spans the K+1 memory dies and manages the mapping of the logical memory address in the host address space to physical memory address, including mapping to the spare memory die when a redundancy replacement has been applied. In other words, the memory controller communicates with the host processor on a memory address space that spans the K memory dies while manages for memory operation in a memory address space that spans the K+1 memory dies. In some embodiments, the memory controller controls and directs access to the spare memory die through the address translation circuit when the memory capacity of the spare memory die is applied, for example, to replace non-functioning or failing memory tiles in the known address space of the K memory dies.

In alternate embodiments, a memory module includes a memory device integrated with a memory controller where the memory device is formed by K+1 memory dies placed side-by-side on an interconnect structure with the memory controller, in a packaging configuration sometimes referred to as 2.5D packaging. In some examples, the interconnect structure is an interposer. In other examples, the K+1 memory dies may be placed side-by-side and surrounding the memory controller on the interconnect structure. Importantly, the K+1 memory dies of the memory device of the present invention may have different packaging construction, either stacked (3D) or 2.5D packaging. The particular packaging construction of the K+1 memory dies and the accompanying memory controller die is not critical to the practice of the present invention.

In some embodiments, the memory controller is configured to monitor the operational condition or the health status of the memory arrays (or tiles) in each memory die. For example, the memory controller may obtain health information of the storage transistors while performing refresh operations. The memory controller may further determine the health or operational status of the memory arrays and/or the storage transistors in the memory arrays while performing error corrections on the read out memory data in a read operation. The memory controller may determine that one or more memory arrays are defective, non-functioning, failing or in declining health. In the present description, a memory array (tile) is deemed defective or failing when one or more storage transistors in the memory array are defective or failing, or other transistors or circuit elements in the memory array are defective or failing. For example, a failing storage transistor or a storage transistor in declining health refers to a storage transistor that is still functional but has degraded electrical properties, such as a smaller than expected memory window, a smaller than expected transistor "on" current (Ion), or any significant deviation from the storage transistor's performance specification. In another example, the memory controller may detect that one or more memory arrays are defective or failing by detecting any significant deviation from the memory device's performance specification.

In some embodiments, the memory controller is configured to determine if one or more memory arrays (tiles) that are defective or are failing should be replaced. When the memory controller determines redundancy replacement is to be applied to a tile in the K memory dies, the memory controller replaces the failing memory tile with a redundant memory tile in the spare memory die. The memory controller manages the address mapping information so that any future incoming request from the host processor addressing the replaced memory tile in the host address space will be directed to the replacement memory tile in the spare memory die.

For example, when a tile in one of the K memory dies is detected to have failed or is failing during the operational lifetime of the memory module, the memory controller replaces the suspect tile using a functioning tile from the spare memory die. In some embodiments, redundancy replacement may be implemented for an individual tile or for a group of tiles. In some embodiments, the address translation circuit of the memory controller manages the mapping of the logical memory address in the host address space to the physical memory address, so that an incoming request from the host processor directed to a replaced memory bank of the K memory dies will be redirected to the replacement memory bank in the spare memory die. The tile replacement operation using the physical memory address of the spare memory die is entirely transparent to the host processor and is managed internally within the memory module by the memory controller. The host processor may continue to operate using the logical memory address of the host address space. Meanwhile, the memory controller controls the physical memory address space of the K+1 memory dies and manages the mapping of the logical memory address to physical memory address, including mapping to the spare memory die when a redundancy replacement has been applied. In this manner, the memory module continues to support the full designated memory capacity even when some tiles or some storage transistors in a tile in the K memory dies may become defective or failing. Furthermore, the memory controller initiates redundancy replacement in anticipation of impending failures or declining health of one or more tiles so that the operational reliability of the memory module is enhanced.

In some embodiments, the address translation circuit of the memory controller (such as the address translation circuit 114 in FIG. 8) is configured to process incoming requests from the host processor and received by the memory module where each incoming request includes a logical memory address in the host address space of the K semiconductor memory dies. Meanwhile, the address translation circuit of the memory controller converts the logical memory address of the incoming request to a physical memory address identifying the storage transistors in the K+1 semiconductor memory dies. In particular, the address translation circuit of the memory controller manages the mapping of logical memory addresses in the host address space that are directed to defective or failing memory arrays and have been replaced to physical memory addresses in the memory address space of the spare memory die. The host processor continues to send requests to the memory module using the logical memory address of the host address space of the K memory dies while the memory controller, through the address translation circuit, manages the mapping of the logical memory address to the physical memory address of the K+1 memory dies, including mapping logical memory address to the physical memory address on the spare memory die when redundancy replacement has been applied.

Memory Device Architecture

In embodiments of the present invention, the memory device described herein implements a tile-based architecture including an arrangement of independently and concurrently operable arrays or tiles of memory transistors where each tile includes memory transistors that are arranged in a three-dimensional array and a localized modular control circuit operating the memory transistors in the tile. The tile-based architecture of the present invention enables concurrent memory access to multiple tiles in the memory device, which enables independent and concurrent memory operations to be carried out across multiple tiles. The tile-based concurrent access to the memory device has the benefits of increasing the memory bandwidth and lowering the tail latency of the memory device by ensuring high availability of storage transistors.

In the present description, memory access concurrency refers to performing multiple memory operations at multiple randomly addressed tiles of the memory device at the same time, with each tile performing a memory operation on an access unit or memory page of memory data. In some examples, the memory operations include read, write and refresh operations. In other words, the memory device is operated with overlapping memory operations being performed across multiple tiles where the memory device continues to receive incoming commands from the controller device while the memory device is executing previously received commands, with each command being executed by or directed to different tiles in the memory device. In the case the memory device is divided into multiple memory channels, memory access concurrency refers to performing multiple memory operations at multiple tiles of each channel of the memory device at the same time. Furthermore, in the present description, the multiple memory operations are performed asynchronously with each other. That is, the multiple memory operations are not initiated at the same clock cycle but rather are initiated at different clock cycles as the commands are received by the memory device (or the memory channel).

Memory access concurrency is particularly beneficial in memory devices with asymmetric read-write latency. In exemplary embodiments of the present invention, the memory device may have a write latency that is much longer than the read latency. For example, the write latency may be 300 ns to $1p$ s while the read latency may be 70-90 ns. In that case, the memory performance is enhanced by having overlapping read and write operations at different tiles occurring simultaneously so that the memory device continues to deliver high memory bandwidth and high memory availability despite what may be a long write latency. Conventional memory devices which do not have asymmetric read-write latency or have short read and write latencies (e.g. DRAM) do not need to implement memory access concurrency as those memory devices usually operate by completing each memory operation before the next operation. For memory devices with an asymmetric read-write latency or a write latency longer than the read latency, such as the memory device in embodiments of the present disclosure, implementing memory access concurrency allows overlapping memory operations to be carried out so as to mask what would be a long write latency so that the memory device performs as if it has a short read and write latency.

Figure 9:
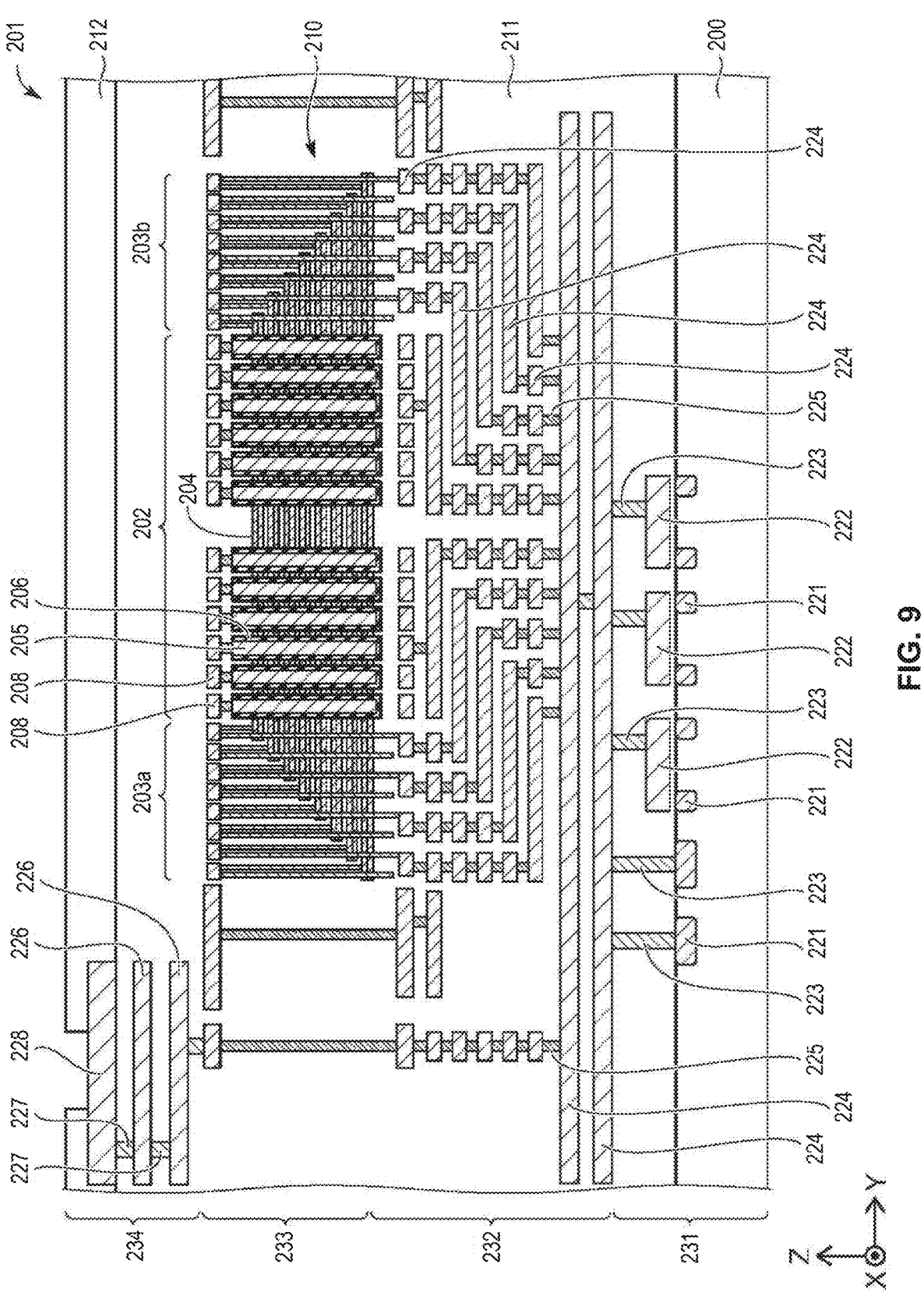
FIG. 9 illustrates a cross-sectional view of a tile in a memory device in the Y-Z plane in embodiments of the present invention.

In embodiments of the present disclosure, the memory structures for forming the memory device of the present invention includes a memory array portion constructed as described above with reference to FIGS. 4(a) and 4(b) to form the 3-dimensional array of NOR memory strings of randomly accessible storage transistors. To complete the memory device, the memory structure includes staircase portions provided at the ends of the memory strings (in the Y-directions), as shown in FIG. 9 below. The thin-film storage transistors of the NOR memory strings are formed in the memory array portion while the staircase portions, on opposite sides of the array portion, include staircase structures to provide connections through conductive vias to the common bit lines and, optionally, the common source lines, of the NOR memory strings. In some embodiments, the common source lines are pre-charged to serve as virtual voltage reference source during programming, reading and erase operations, thereby obviating the need for a continuous electrical connection with the support circuitry during such operations. In the present description, the common source lines are described as being electrically floating to refer to the absence of a continuous electrical connection to the common source lines. In embodiments of the present disclosure, various processing steps for forming staircase structures in the memory structure can be used. The processing steps for forming the staircase structures can be before, after, or interleaved with the processing steps for forming the memory array portion.

The memory structure, described above with reference to FIGS. 4(a) and 4(b), illustrates the construction of a memory array including a three-dimensional array of NOR memory strings. The memory structure can be used as a building block for forming a high capacity, high density memory device. In embodiments of the present disclosure, the memory structures described above can be used as a building block to form a tile, which includes a memory array as a modular memory unit and a localized modular control circuit formed under the memory array. The memory device of the present disclosure is formed using an array of tiles. In one exemplary embodiment, a memory device is organized as a two-dimensional array of tiles, arrayed along the X- and Y-directions, where each tile includes a three-dimensional array of storage transistors with support and control circuitry for each tile formed under the respective tile. More specifically, a memory device includes multiple memory arrays of thin-film storage transistors organized as a 2-dimensional array of "tiles" (i.e., the tiles are arranged in rows and columns) formed on a planar surface of a semiconductor substrate. Each tile can be configured to be individually and independently addressed. As thus configured, the tile is a modular unit that allows flexibility in configuring the memory module to adapt to application requirements.

FIG. 9 illustrates a cross-sectional view of a tile in a memory device in the Y-Z plane in embodiments of the present invention. Referring to FIG. 9, a tile 201 is formed on a semiconductor substrate 200. The memory structure of the tile 201 is formed in an insulating film 211 with a passivation film 212 formed thereon. In some embodiments, the insulating film 211 is formed of silicon oxide (SiOx) and the passivation film 212 is formed of polyimide. In the present embodiment, the memory structure includes a three-dimensional array ("memory array") of storage transistors, constructed as described above with reference to the memory structure of FIG. 4(a) or 4(b). More specifically, the memory structure can be a three-dimensional array of charge-trapping type storage transistors (FIG. 4(a)) or a three-dimensional array of junctionless ferroelectric storage transistors (FIG. 4(b)).

P-type or N-type diffusion regions 221 are formed in the upper surface of the semiconductor substrate 200. Other structures (not shown in FIG. 9), such as isolation structures or shallow trench isolation (STI) structures, may also be formed in the semiconductor substrate 200. Gate electrodes 222 are formed on and insulated from the semiconductor substrate 200 by a gate dielectric layer. For example, the gate dielectric layer may be a thin silicon oxide layer. The gate electrodes 222 together with the P-type and N-type diffusion regions 221 form transistors in the semiconductor substrate 200, where the transistors can be used to form circuit elements. For example, the transistors can be used to form the support circuitry for operating the storage transistors in the three dimensional NOR memory array formed in the tile 201. The circuit elements are interconnected to form the support circuitry by contacts 223 connecting to one or more layers of interconnects 224 and vias 225 formed in the insulating film 211 in a lower interconnect portion 232. In some embodiments, the support circuitry of the storage transistors to be formed are provided in the circuit element portion 231 and the lower interconnect portion 232. For example, the support circuitry forming the modular control circuit for the array of storage transistors is formed in the circuit element portion 231 and the interconnect portion 232.

In the tile 201, a 3-D NOR memory array 210 is formed in a memory array portion 233. An upper interconnect portion 234 is formed on the memory array portion 233. Interconnects 226 and vias 227 are provided in the insulating film 211 in the upper interconnect portion 234 for forming additional electrical connections. In some embodiments, a conductive pad 228 is provided in the upper interconnect portion 234 for connecting to circuit elements external to the semiconductor memory device. For instance, the passivation film 212 is formed on and encapsulates the upper intercon-nect portion 234 with an opening exposing at least a part of the conductive pad 228.

In the memory array portion 233, the thin-film storage transistors are organized as a three-dimensional array of NOR memory strings in the memory array portion 202. The memory array portion 202 is provided between staircase portions 203a and 203b. The staircase portions 203a and 203b are formed at opposite ends of the tile 201. Connec-tions through conductive vias to common bit lines and, optionally, common source lines, of the NOR memory strings are provided in the staircase portions 203a and 203b. In some embodiments, the common source lines are pre-charged and then held at a relatively constant voltage to serve as a virtual voltage reference during programming, erase and read operations, thereby obviating the need for a continuous electrical connection with the support circuitry during such operations. In FIG. 9, the array portion 202 and the staircase portions 203a and 203b are not drawn to scale. For example, the array portion 202 may be much larger in area than either of staircase portions 203a and 203b.

In the memory array portion 202, the thin-film storage transistors are formed at the intersection of the common drain line and common source line (collectively referenced by numeral 204) and a local word line 205. A gate dielectric layer 206 is formed between the conductive local word line and the channel layer (not shown in FIG. 9). With the common drain lines and common source lines arranged in multiple planes running in the Y-direction and the local word lines 205 formed as columnar structure extending in the Z-direction and arranged in the Y-direction, storage transis-tors are formed in a three-dimensional array on multiple planes in the Z-direction, along each memory string in the Y-direction and arranged in multiple rows in the X-direction. In FIG. 9, global word lines conductors 208 provide elec-trical connectivity between circuits 222 under memory array 210, and local word lines 205 associated with the three-dimensional memory stacks.

In the above-described embodiments, the supporting cir-cuitry is described as being formed under the memory array portion 233. Such configuration is illustrative only and not intended to be limiting. For example, in other embodiments, both the memory array portion and the supporting circuitry may be directly formed on the semiconductor substrate 200. In such a case, for example, the supporting circuitry may be located at the periphery of the memory array portion. In other embodiments, the supporting circuitry may be formed on another semiconductor substrate. In such a case, for example, the semiconductor substrate in which the memory array portion is formed and the semiconductor substrate in which the supporting circuitry is formed are bonded after formation of the respective memory and circuit elements.

FIG. 9 illustrates one exemplary embodiment of a tile or a physically isolated memory array of storage transistors. The depiction of the tile 201 in FIG. 9 is illustrative only and not intended to be limiting. FIG. 9 is provided to illustrate the incorporation of the memory structure of FIG. 4(b) or 4(a) to form a tile including a modular memory unit (memory array) and a modular control circuit. The tile can then be used as the building block to form a memory device including multiple arrays of three-dimensional storage tran-sistors, such as junctionless ferroelectric storage transistors, to provide the desired memory capacity at a high-density level.

In embodiments of the present invention, the tile 201 implements a horizontal NOR (HNOR) memory architec-ture where the bit lines are stacked in multiple planes and the word lines are formed as columnar structures. The bit lines are connected to a bit line driver circuit (including bit line select transistors) to select and drive a memory page of bit lines for memory operation. The word lines are connected to a word line driver circuit (including word line select tran-sistors) to select one of the word lines in the tile 201 for memory operation. As thus configured, in the support cir-cuitry formed under the memory array, the bit line driver circuit is placed under the staircase portions 203a, 203b while the word line driver circuit is placed under the memory array portion 202. Such configuration enables a compact circuit under array to be formed as the bit line drive/select transistors are typically smaller in size than the word line drive/select transistors. In a memory device of thin-film storage transistors, such as charge-trapping type storage transistors or ferroelectric storage transistors, the word line drive/select transistors are usually configured to handle a larger on-off voltage difference than the bit line drive/select transistors. Therefore, word line driver circuit is usually much larger than the bit line driver circuit.

The HNOR memory architecture of the present disclosure enables a compact circuit under array to be formed as the bit line drive/select transistors require a smaller footprint and can be formed tugged under the staircase portions while the larger word line drive/select transistors are placed under the memory array portion where there is more room to accom-modate the larger transistors. Accordingly, the tile 201 in the present embodiment is scalable as the size of tile 201 is not limited by the size of the staircase structure or the driver circuits. This is in contrast to conventional memory archi-tectures where the word lines are stacked and the bit lines are formed in columnar structures (e.g. NAND flash memory). In these conventional memory architectures, the larger word line drive/select transistors have to be placed under the staircase and the large size of the word line drive/select transistors determines the tile size, or limits the size of the memory tile to a minimum size. The conventional memory architectures with stacked word lines do not support a memory device with a large number of tiles as each tile needs to have a large tile size to accommodate the word line drive/select transistors that have to be placed under the staircase portions. The HNOR memory architecture imple-mented in the memory device of the present invention enables compact tile size to be formed so that the memory device can be formed to include a large number of tiles. A memory device with a large number of tiles enables con-currency of memory operations and increases the memory bandwidth as well as the memory availability of the memory device.

Figure 10:
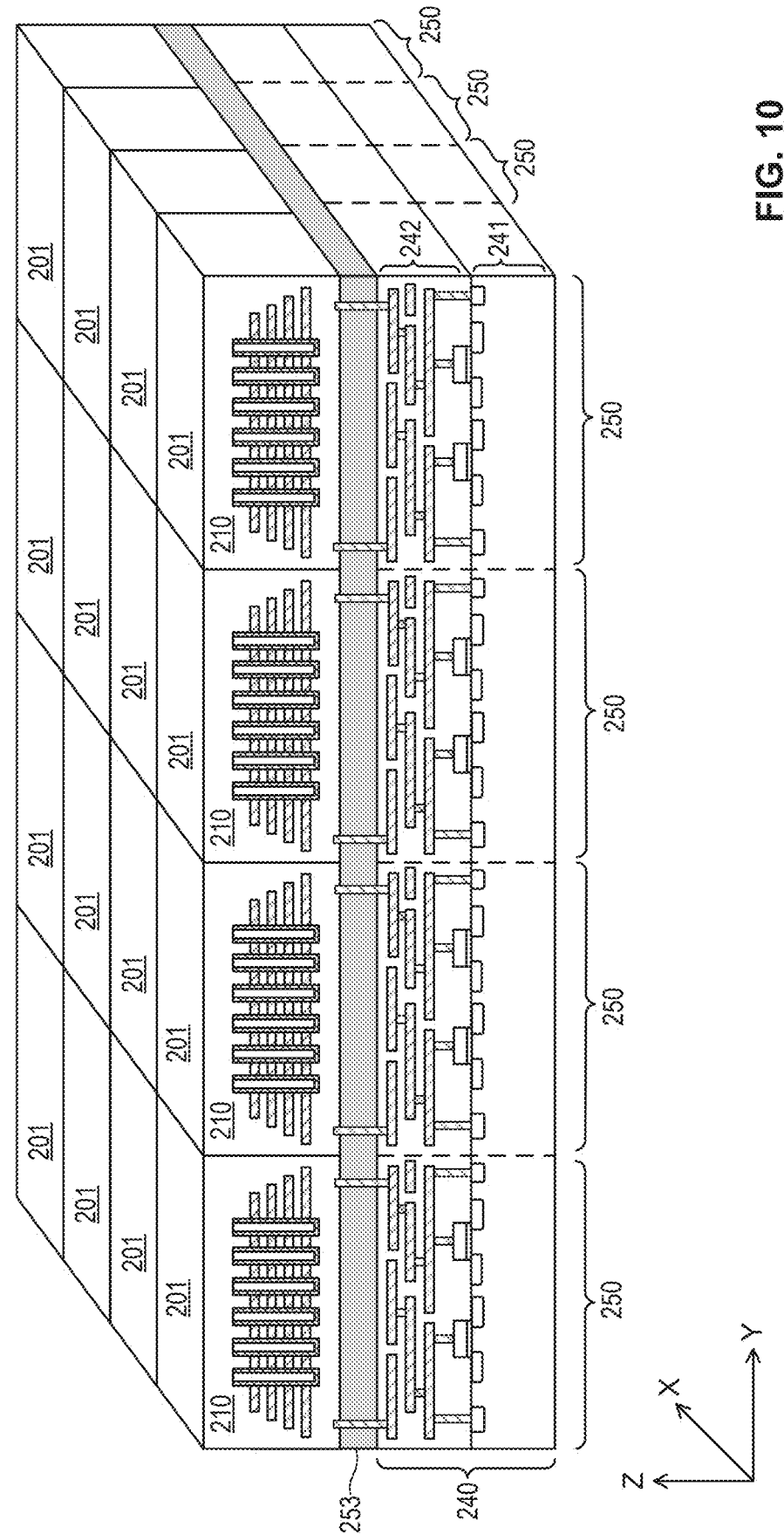
FIG. 10 illustrates a two-dimensional array of tiles forming a portion of a memory device in embodiments of the present invention.

FIG. 10 illustrates a two-dimensional array of tiles form-ing a portion of a memory device in embodiments of the present invention. Referring to FIG. 10, in embodiments of the present disclosure, a memory device 280 includes a two-dimensional array of tiles 201, where each tile includes a memory array 210 of a three-dimensional array of storage transistors and a modular control circuit 250. The tile 201 can be constructed as described above, such as with refer-ence to FIGS. 3, 4(a), 4(b) and 9. The memory arrays in tiles

201 are formed above a semiconductor substrate portion 240. An insulating layer 253 may be provided between the semiconductor substrate portion 240 and the memory arrays 210 formed on the substrate. Modular control circuits (CuA) 250 implementing the support circuitry for operating the storage transistors in each tile are formed in the semiconductor substrate portion 240. In particular, each tile 201 is provided with its own modular control circuit (CuA) 250 formed under the respective memory array 210. In the present description, the semiconductor substrate portion 240 refers to the semiconductor substrate 241 and the interconnect structures 242 formed above the semiconductor substrate 241. Furthermore, in the embodiments of the present invention, each modular control circuit 250 has about the same planar dimensions (in the X-Y plane) as the memory array 210

In the memory device 280, each tile is controlled by the respective modular control circuit 250 to perform memory operations on the storage transistors in the memory array. The memory device also includes additional periphery control circuit in the regions between the tiles or in the peripheral of the memory device. In some examples, the periphery control circuit includes input/output circuits for communicating with a memory controller, protection circuits (such as against electrostatic discharge), datapath circuits, interface circuits and other control logic circuits. The periphery control circuit may further include analog circuits, such as regulators, voltage reference circuits, or temperature sensors, and non-volatile memories, such as efuse or one-time programmable memories for storing trimming data. The circuitry in the periphery control circuit supports the operation of each modular control circuit 250 but do not directly control the memory operations to the storage transistors, such as memory operation to read from or write to the storage transistors.

As thus configured, the memory device 280 implementing the tile-base architecture of the present invention includes a large number of tiles, each tile formed by physically isolated array of memory cells as a modular memory unit with each modular memory unit being operated by a localized modular control circuit (CuA). In other words, the memory array includes a large number of tiles with each tile being independently operated by the modular control circuit formed in each tile. Each modular memory unit is a physically isolated array of memory cells in that each modular memory unit includes its own three-dimensional array of memory cells and its own staircase structures to connect the memory cells to the modular control circuit. Each modular memory unit is an individually and independently operable memory array and the multiple modular memory units are multiple instances of the same modular memory unit structure, with each individual modular memory unit being physically isolated from the other modular memory units. Each modular memory unit is operated by its own localized modular control circuit to perform semi-autonomous memory operations (such as read and write operations).

In embodiments of the present invention, the memory device interacts with a memory controller, such as the memory controller described above with reference to FIGS. 1(*a*), 1(*b*), 2(*a*), 2(*b*), 7 and 8, to receive incoming commands with addresses for performing memory operations specified by the commands at respective memory tiles specified by the addresses. In the present description, each tile with the modular control circuit is described as being operated semi-autonomously in that a modular control circuit receives a command with an address that designates its associated memory array and the modular control circuit then operates independently to execute the memory operation specified by the command at its associated memory array. The modular control circuit may receive regulated voltage levels or clock signals from the periphery control circuit but the modular control circuit does not receive any control signals relating to the memory operation from the periphery control circuit. Rather, the modular control circuit is itself the processing unit for the associated modular memory unit and generates all the control signals to control the associated modular memory unit (or the memory array) to perform memory operations.

A salient feature of the memory device of the present invention is that each tile is used as an operating unit of memory access, that is, each tile operates on an access unit of memory data, such as a page of memory data, or a memory page. Accordingly, each command from the memory controller is addressed to a single tile and each tile operates on the command to read or write a memory page of memory data, independent of commands addressed to other tiles. As described above, as used herein, an access unit of memory data or a memory page refers to the quantity of data bits of memory data in each memory access request from a host device to the memory controller. In some examples, the access unit is 512 bits of memory data. It is instructive to note that the present description discusses only the memory data in the access unit with the understanding that each memory access may include additional data bits, such as meta data bits or error flag or other data bits used by the host but are not strictly memory data.

The memory device 280, when coupled and operated by a memory controller, implements memory access concurrency where multiple memory operations are performed at multiple tiles at the same time, each memory operation being performed independently of each other with overlapping memory operations being performed at different memory tiles. The memory controller receives memory access requests from a host device and issues commands (with memory addresses) to the memory device in response to the memory access requests. For example, the memory controller issues a command to a respective tile of the memory device every 4 ns or 5 ns. In embodiments of the present disclosure, the memory controller implements tile or bank conflict avoidance schemes to avoid sending a new command to a tile that is processing an existing command. Tile conflict avoidance is particularly beneficial when the memory device has asymmetric latencies, such as a much longer write latency as opposed to the read latency. For example, in the case the write latency is much longer (e.g. 1 μs) than the read latency (e.g. 90 ns), the memory controller enables concurrent operations by performing a write operation at one tile with overlapping read and write operations that are carried out in other tiles. In this manner, a long write latency does not result in a read operation being stalled while waiting for the write operation to complete. Examples of tile or bank conflict avoidance scheme are described above with reference to FIG. 8.

As thus configured, the memory device receives commands from the memory controller where each command is addressed to one tile and no command is issued to a tile that is currently executing another command. Thus, the memory device receive commands that activates different tiles that are not currently executing a command. Furthermore, each command is issued for the entire access unit of memory data so that each tile is operated independently to execute a memory operation on the entire access unit or memory page of memory data. In this manner, the tiles in the memory device can be individually addressed and are operated individually and concurrently with each tile operating on the full memory page of memory data for each memory access request. The memory device, operated by the memory controller, ensures high availability of tiles, thereby increasing the memory bandwidth and decreasing the tail latency of memory access requests. Importantly, by dividing the memory address space of the memory device into a large number of tiles, the probability of memory access conflicts where incoming memory accesses are addressed to the same tile is reduced significantly, contributing to a low tail latency and increased quality of service level for the memory device. In particular, tail latency of the memory device of the present disclosure is improved by having a large number of tiles being available for host memory access so that situations where host memory access has to be stalled due to all or most memory banks being activated is obviated.

In embodiments of the present invention, each tile of the memory device is operated by a localized modular control circuit (CuA). Referring still to FIG. 10, each modular control circuit 250 is a replicated complete control circuit for each tile so that memory operation within each tile is self-contained. The modular control circuit 250 includes a sequencer functioning as an intelligent processing unit to execute commands received from the memory controller and addressed to the respective tile and to trigger memory operations at the associated tile in response to the received commands. Exemplary embodiments of the modular control circuit are described below with reference to FIGS. 11 and 12. The structures and configurations of the modular control circuit described herein are illustrative only and not intended to be limiting. Other configurations and design schemes can be used in other embodiments.

Figure 11:
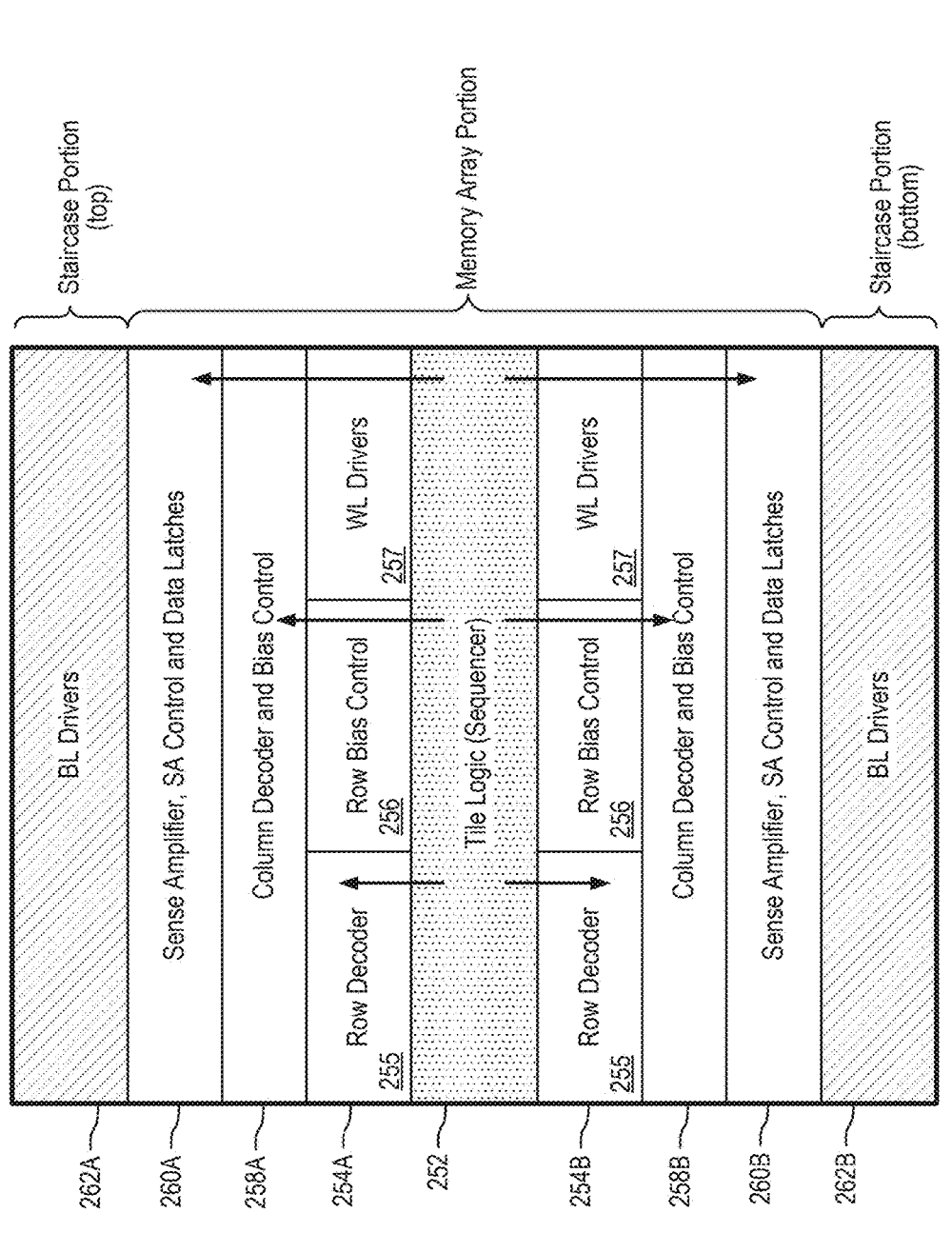
FIG. 11 is a block diagram illustrating a modular control circuit that can be incorporated in each tile of the memory device to provide intelligent and semi-autonomous memory operation control in some embodiments of the present invention.

FIG. 11 is a block diagram illustrating a modular control circuit that can be incorporated in each tile of the memory device to provide intelligent and semi-autonomous memory operation control in some embodiments of the present invention. In some examples, the modular control circuit 300 of FIG. 11 can be used to implement the modular control circuit 250 of FIG. 10 or to implement support circuitry or CuA described in the above embodiments. Referring to FIG. 11, a modular control circuit (CuA) 300 implements support circuitry for a modular memory unit and is formed localized under a respective memory array. The modular control circuit 300 includes circuit portions that are formed under the staircase portions of the tile and circuit portions that are formed under the memory cell array portions of the tile. In general, the modular control circuit 300 includes bit line and word line selection circuits for selecting a memory page of storage transistors from the memory array in response to the received address, bias control circuits for controlling the voltage bias to be applied to the selected bit lines and word lines to perform the memory operation as triggered by the received command, and control circuits.

For the purpose of facilitating the present description, the following exemplary memory device configuration is used. In some examples, each memory array in the memory device or in a memory channel of the memory device includes M number of word lines. In each memory operation, one word line out of M word lines is activated to select P number of memory pages. Each memory page includes Q number of data bits. Therefore, each memory array includes P*Q number of bit lines formed on multiple planes of the memory array and each bit line is associated with a NOR memory string including M number of storage transistors. With a word line being activated to select P number of memory pages, Q number of bit lines is selected to select a memory page of storage transistors. Furthermore, in the present description, the staircase portions of the tile are referred to as a top staircase portion and a bottom staircase portion. The terms "top" and "bottom" are used to facilitate reference to the figures and are not intended to denote specific direction or specific placement of the circuit elements.

In embodiments of the present invention, the modular control circuit 300 includes a circuit portion 252 formed in a center portion of the modular control circuit. The circuit portion 252 includes control circuits, referred to as tile logic circuits. In some embodiments, the tile logic circuit 252 includes a sequencer or processor unit to execute memory operation sequences at the memory array. In particular, the sequencer receives incoming commands, with associated memory address and write data (where applicable), from the memory controller addressed to the associated tile. The sequencer decodes each command, such as decoding the microcode in each received command, and executes the instructions in accordance with the command to perform the memory operation at the memory array, each memory operation including a sequence of operations or steps to be operated on the storage transistors of the memory array. For example, the command can be a read command to read data from a particular memory page in the memory array. In another example, the command can be a write command with write data to store data into a particular memory page in the memory array. In yet another example, the command can be a refresh command to refresh the stored data of a particular page in the memory array. In particular, the sequencer generates control signals to execute the operation sequence and the timing of each memory operation at the memory array. For example, the sequencer generates control signals to direct the word line and bit line selection, the application of the bias voltages and the timing sequence for performing the various operation sequence, such as sensing, programming and erasing of selected storage transistors. Importantly, the sequencer in each modular control circuit operates independently, without requiring any control from circuit elements outside of the modular control circuit. In this manner, the sequencer in the tile logic circuit 252 imparts intelligence into the modular control circuit to enable semi-autonomous memory operation to be carried out at the modular control circuit 300.

In embodiments of the present invention, the modular control circuit 300 includes circuit portions 254A and 254B which together implement the row circuit for selecting and activating a word line in the memory array. In the present illustration, the row circuit is divided into two circuit portions 254A and 254B that are formed adjacent the tile logic circuit portion 252 in a center portion of the modular control circuit. In other embodiments, the row circuit can be formed in a single circuit portion 254 and provided on one side of the tile logic circuit portion 252. The row circuit includes a row decoder circuit 255, a row bias control circuit 256 and a word line select circuit 257, also referred to as a word line driver circuit. In the present illustration, the circuit portions 254A and 254B can be configured to each control half the number of word lines in the memory array. For example, the circuit portion 254A can be configured to control the top half of the word lines in the memory array while the circuit portion 254B can be configured to control the bottom half of the word lines in the memory array.

The row decoder circuit 255 is configured to decode the memory address accompanying the command received by the tile logic 252 to determine the word line that is to be activated for memory operation. The row bias control circuit 256 generates and controls the word line voltage values for biasing the selected word line as a function of the memory operation to be performed. The row bias control circuit 256 also generates and control the word line voltage values for the unselected word lines, such as for minimizing disturb of unselected memory cells. In one example, the selected word line may be driven to a first voltage value for the read operation and a second, different voltage value for the write operation. In another example, the unselected word lines may be driven to an inhibit voltage value to minimize the disturb of the stored data in the unselected memory cells. Finally, the word line driver circuit 257 includes word line drive/select transistors connected to the M word lines in the memory array. In response to the decoded address from the row decoder 255 designating a word line for selection, the word line driver circuit 257 selects the designated word line and drives the selected word line to the appropriate bias voltage values associated with the memory operation to be performed. The word line driver circuit 257 further drives the other M−1 unselected word lines to the inhibit voltages. The row circuit (circuit portions 254A, 254B) operates in this manner to select and drive a word line out of M word lines for memory operation.

The modular control circuit 300 includes circuit portions 258A and 258B which together implement the column circuit for selecting and activating a bit line in the memory array. In the present illustration, the column circuit is divided into two circuit portions 258A and 258B that are formed adjacent respective row circuit portions 254A, 254B. In other embodiments, the column circuit can be formed in a single circuit portion 258 and provided on one side of the tile logic circuit portion 252. The column circuit includes a column decoder circuit and a column bias control circuit. In the present illustration, the circuit portions 258A and 258B can be configured to each control half the number of bit lines in the memory array. For example, the circuit portion 258A can be configured to control a first half of the bit lines in the memory array while the circuit portion 258B can be configured to control a second half of the bit lines in the memory array.

The column decoder circuit in the column circuit 258A or 258B is configured to decode the memory address accompanying the command received by the tile logic 252 to determine the memory page of bit lines that are to be activated for memory operation. The column bias control circuit in the column circuit 258A or 258B generates and controls the bit line voltage values to drive the selected bit lines as a function of the memory operation to be performed. The column bias control circuit also generates and controls the bit line voltage values for the unselected bit lines, such as for minimizing disturb of unselected memory cells. In one example, the selected bit line may be driven to a third voltage value for the read operation and a fourth, different voltage value for the write operation. In another example, the unselected bit lines may be driven to an inhibit voltage value to minimize disturb of the stored data in the unselected memory cells.

The modular control circuit 300 includes circuit portions 260A, 260b which together implements the sensing and latch circuits. In the present illustration, the sensing and latch circuits are divided into two circuit portions 260A and 260B that are formed adjacent respective column circuit portions 258A, 258B. The placement and division of the sensing and latch circuit is a function of the configuration of the staircase structure of the tile which provides the bit lines of the NOR memory strings of the memory array for connection to the modular control circuit. When the staircase structure includes two portions formed at two ends of the tile, it is beneficial to place corresponding sensing and latch circuits near the respective bit line staircase portions for better sensing and driving performance.

In circuit portions 260A and 260B, the sense amplifier circuits include Q number of sense amplifiers corresponding to the number of data bits in a memory page. The Q number of sense amplifiers is coupled to Q number of selected bit lines. Accordingly, each memory operation is performed on a memory page of data bits and no sense amplifier selection is needed. By providing the same number of sense amplifiers in the modular control circuit 300 as the number of data bits in the memory page, the size of the modular control circuit is kept compact to enable it to be formed under each memory array. In the present embodiment, the Q number of selected bit lines are provided through top and bottom staircase portions. Therefore, half of the sense amplifiers are provided in the circuit portion 260A to connect to Q/2 selected bit lines at the top staircase portion and the other half of the sense amplifiers are provided in the circuit portion 260B to connect to Q/2 selected bit lines at the bottom staircase portion.

The data latch circuits may include two or more data latches or registers for storing outgoing read data or incoming write data. The sense amplifier control circuit directs the operation of the sense amplifiers and the data latches to either sense read data form the selected bit lines or to drive write data onto the selected bit lines. In some examples, the sense amplifiers and data latches and the bias control circuit can be configured in the manner as described above with reference to FIG. 6.

In embodiments of the present invention, the modular control circuit 300 includes circuit portions 262A and 262B which together implement the bit line driver circuit for selecting and driving the bit lines of a selected memory page in the memory array (for example, Q number of bit lines). The bit line driver circuit includes a set of bit line select transistors to select and drive the selected bit lines. In the present illustration, the bit line select circuit is divided into two circuit portions 262A and 262B that are formed at opposite ends of the modular control circuit. Furthermore, the two circuit portions of the bit line select circuit are formed under respective staircase portions at opposite ends of the tile.

More specifically, the bit line select circuit includes a first set of bit line select transistors formed under the top staircase portion and a second set of bit line select transistors formed under the bottom staircase portion. As described above, in the present embodiment, the P*Q number of bit lines are provided through top and bottom staircase portions. That is, half of the bit lines of the memory array are connected to the staircase structure formed at a first end (e.g. the top end) of the tile to be connected to bit line select transistors formed under the staircase structure. The other half of the bit lines of the memory array are connected to the staircase structure formed at a second, opposite end (e.g. the bottom end) of the tile to be connected to bit line select transistors formed under the staircase structure. As thus configured the first set of bit line select transistors (circuit portion 262A) are formed under the top staircase portions to connect to (P*Q)/2 bit lines and to select and drive Q/2 bit lines for memory operation. The second set of bit line select transistors (circuit portion 262B) are formed under the bottom staircase portions to connect to (P*Q)/2 bit lines and to select and drive Q/2 bit lines for memory operation. The bit line select circuit therefore selects Q number of bit lines from P*Q number of bit lines in the memory array for memory operation.

As thus configured, the bit line select transistors in the first set and the second set are connected to the bit lines of the NOR memory strings at the top and bottom staircase portions for selecting and driving the selected bit lines to appropriate voltage levels for read and write operations. In particular, the bit line select transistors select a memory page of Q number of bit lines from P*Q total bit lines in response to the column decoder decoding the memory address accompanying the command received by the tile logic 252. Through the sense amplifier circuits, the bit line select transistors apply the bias voltages generated by the column bias control circuit to the selected bit lines to perform the designated memory operation. Unselected bit lines are left floating or not actively biased to a specific voltage potential.

In operation, at the modular control circuit 300, the tile logic 252 receives an incoming command and memory address. The row decoder 255 decodes the memory address to determine the word line to be selected. The row bias control circuit 256 generates the bias voltage levels for the selected and unselected word lines. The word line driver circuit 257 select the one designated word line out of M word lines for memory operation. Meanwhile, the column decoder (in circuit portions 258A, 258B) decodes the memory address to determine the memory page to be selected. The column bias control circuit generates the bias voltage levels for the selected bit lines The bit line driver circuit (circuit portions 262A, 262B) selects Q number of bit lines of the selected memory page to be coupled to the sense amplifiers. The sequencer in the tile logic circuit 252 controls the sequence and the timing of the various steps to execute the memory operation. For example, for a read operation, the sense amplifier first pre-charge the selected bit lines and then senses the current or voltage value on the selected bit lines as a result of the storage transistors in the selected memory page being activated by the selected word line. The sensed data values for the Q data bits are stored in the data latches (circuit portions 260A and 260B) to be read out by the memory controller on the I/O bus of the memory device. For a write operation, the sense amplifier pre-charge the selected bit lines and drives the bit line bias voltage according to the write data values (stored in the data latches) onto the selected bit lines, which are then stored into the storage transistors in the selected memory page being activated by the selected word line. In some embodiments, the unselected bit lines are biased to an inhibit voltage value by virtual of capacitive coupling by the unselected word lines. The sequencer executes the read and write operations, with each operation including various stages with different bias voltage values and timing. The sequencer manages the sequence of the stages in each memory operation as well as the timing of each of other stages.

In the present embodiment, the modular control circuit 300 is configured with the tile logic circuit 252 placed in a center portion with the decoder, bias control, select, sensing and latching circuits arranged on two sides of the tile logic circuit. In this arrangement, the control signals from the tile logic circuit 252 to the other circuits can be routed over the tile area, such as using conductive interconnects and vias in the interconnect portion 232 (FIG. 9).

Figure 12:
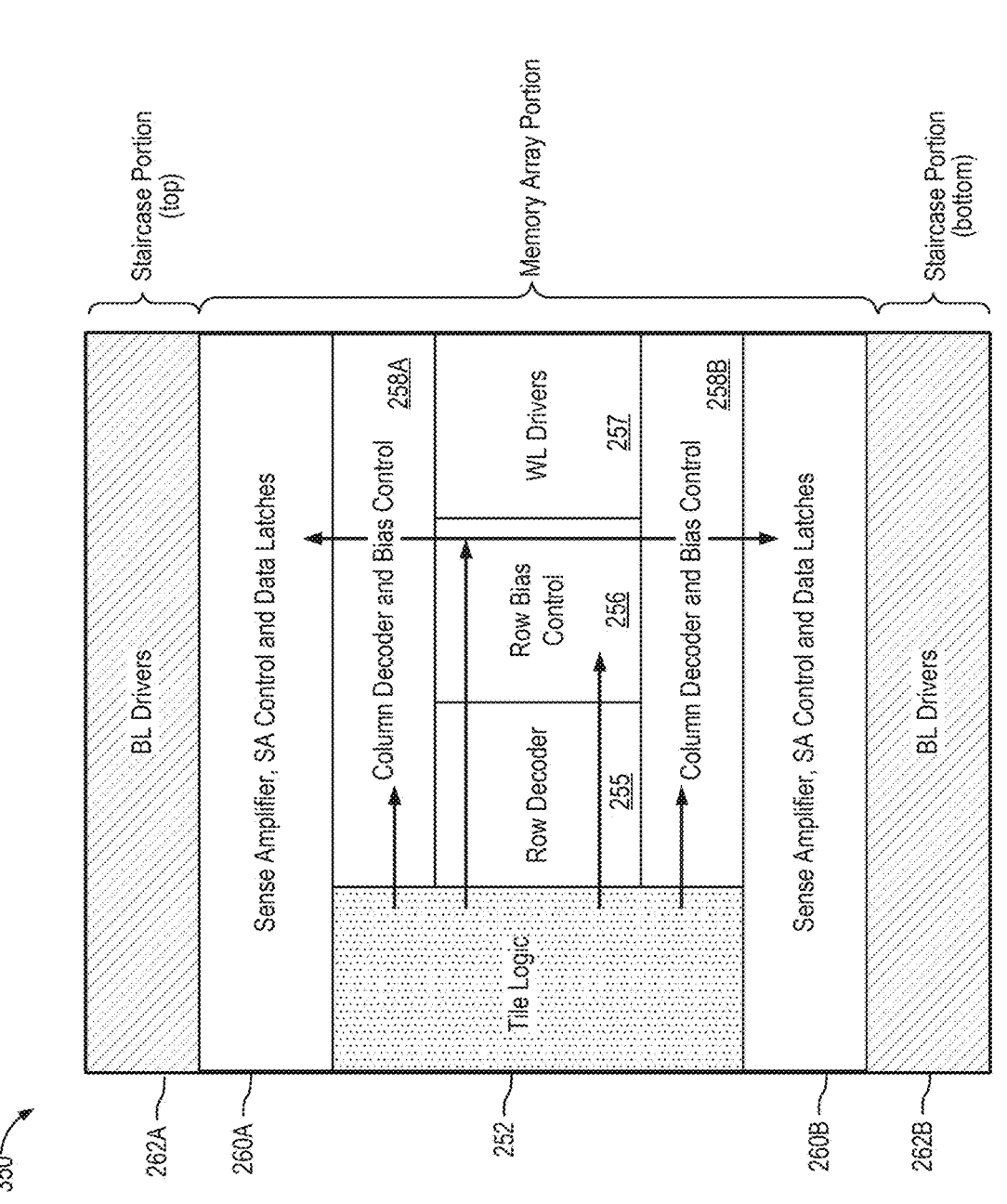
FIG. 12 is a block diagram illustrating a modular control circuit that can be incorporated in each tile of the memory device in alternate embodiments of the present invention.

The configuration of the modular control circuit 300 in FIG. 11 is illustrative only and not intended to be limiting. The circuits in the modular control circuit 300 can be arranged in other configurations depending on the size of the transistors or circuit elements and other design requirements, such as signal routing needs. FIG. 12 is a block diagram illustrating a modular control circuit that can be incorporated in each tile of the memory device in alternate embodiments of the present invention. Referring to FIG. 12, a modular control circuit 350 includes the same circuit elements as the modular control circuit 300 of FIG. 11 and same elements are given the same reference numerals to simplify the discussion. Modular control circuit 350 is configured with the tile logic circuit 252 being placed on the side of the tile area. The row circuit, including the row decoder 255, the row bias control circuit 256 and the word line driver circuit 257, is placed in a center portion adjacent to the tile logic circuit 252. The column decoder and bias control circuits 258A and 258B are similarly placed adjacent to the tile logic circuit 252 and on two sides of the row circuit. In some examples, the circuit layout of the modular control circuit 350 accommodates sense amplifiers or column decoder circuits that may occupy a bigger area so that placing the tile logic on the side portion results in a more efficient use of the tile area. In the configuration of the modular control circuit 350, the routing of the control signals from the tile logic circuit 252 to the other circuit elements may involve routing in two different directions.

In the modular control circuit 300 of FIG. 11, the control signals from the tile logic circuit 252 to the other circuits can be routed in one direction only, e.g. from top to bottom or vice versa, over the tile area, as denoted by the arrows in FIG. 11. In that case, the command and address signals can be routed to the modular control circuit 350 of each tile using the routing area between tiles in the memory device and also using some area over the tile. In the modular control circuit 350 of FIG. 12, the control signals from the tile logic circuit 252 to the other circuits may have to be routed in both the horizontal and vertical directions, as denoted by the arrows in FIG. 12. In that case, the command and address signals to the modular control circuit 350 of each tile are generally routed using the routing area between tiles in the memory device.

Figure 13:
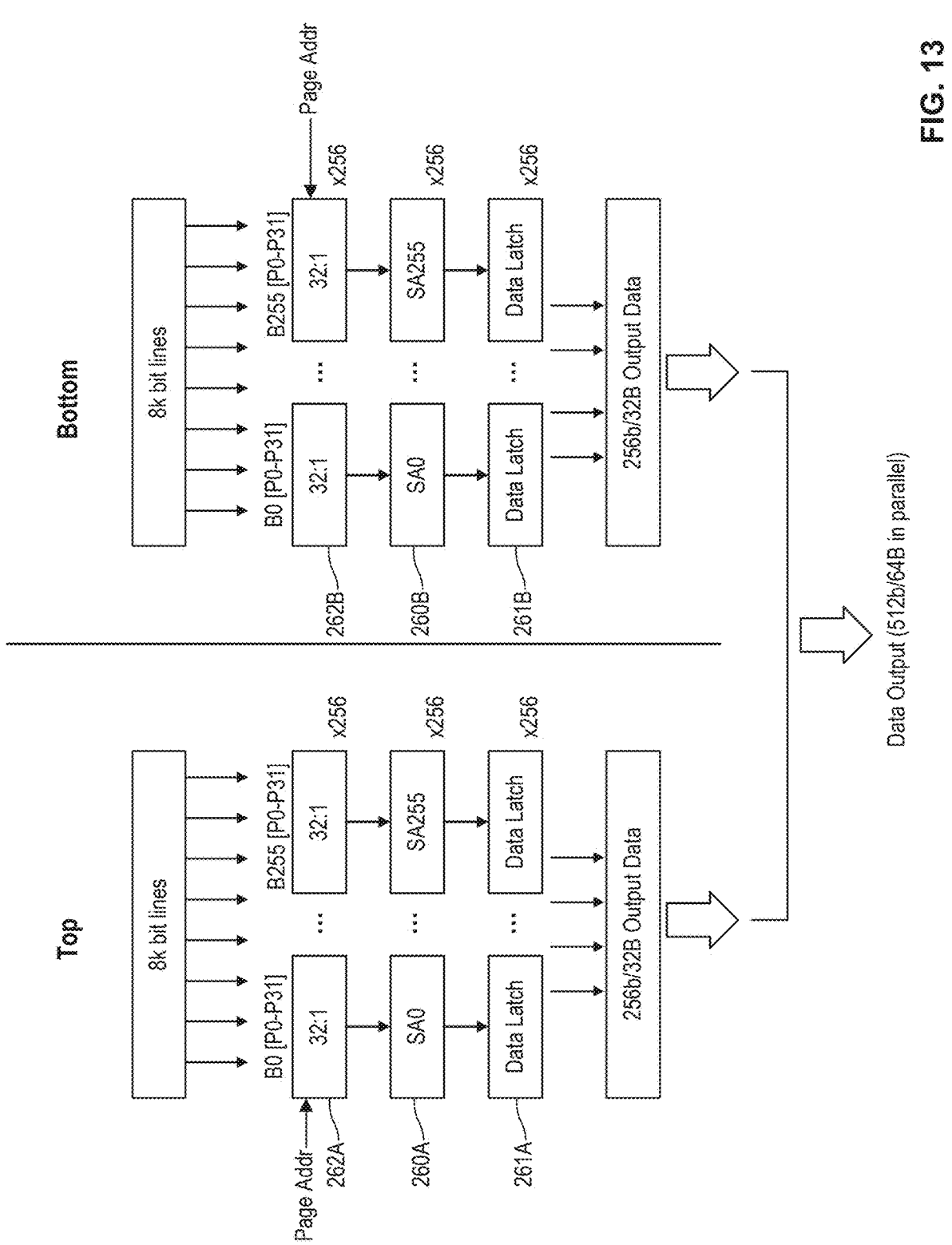
FIG. 13 is a block diagram illustrating the bit line selection and sense amplifier configuration in the modular control circuit in embodiments of the present invention.

FIG. 13 is a block diagram illustrating the bit line selection and sense amplifier configuration in the modular control circuit in embodiments of the present invention. The circuit elements in the block diagram of FIG. 13 are illustrative of the circuit elements in the modular control circuits of FIG. 11 or 12. Furthermore, for ease of description, the memory array is assumed to have 16,384 bit lines so that each word line select one memory page out of 32 memory pages and the memory page size is 512 bits. Additional data bits for meta data or error correction or health indication may be provided but are not included in the present illustration for simplicity purpose. Referring to FIG. 13, the 16 k bit lines of the memory array are divided into two portions to be connected through two staircase structures to the modular control unit. In the present illustration, a top staircase portion connects to 8,192 bit lines and a bottom staircase portion connects to the other 8,192 bit lines. At each staircase portion, the bit lines are connected to respective bit line driver circuit each of which selects bit lines for half the memory page, or 256 bit lines. For instance, at the top staircase portion, the bit line driver circuit includes 256 selector circuits, each selector circuit selecting one bit line out of 32 bit lines. Similarly, at the bottom staircase portion, the bit line driver circuit includes 256 selector circuits, each selector circuit selecting one bit line out of 32 bit lines. The selector circuits receive the page address to determine which bit line is to be selected. The outputs of the 256x2 selector circuits, corresponding to 256x2 selected bit lines, are coupled to respective sense amplifier circuits. A set of 256 sense amplifiers is provided for the top portion and a set of 256 sense amplifiers is provided for the bottom portion. The 256x2 sense amplifiers are then coupled to respective data latches. For example, a set of data latches 261A is coupled to the sense amplifiers 260A and a set of data latches 261B is coupled to the sense amplifiers 260B.

FIG. 13 illustrates the data flow for a read operation. Sensed data from the 256x2 sense amplifiers are stored in the data latches 261A, 261B for output to the memory controller. Thus each set of data latches provides 256 bits or 32 bytes of output data. The memory controller receives and combine data from both sets of data latches to obtain a memory page of 512 bits or 64 bytes of memory data. The configuration of FIG. 13 also applies for write operation, in which case 512 bits of write data are received into the modular control circuit and stored into the two sets of data latches 261A and 261B. The bit line driver circuits select the 512 bit lines of the memory page to be written and the sense amplifiers drive the write data onto the selected bit lines.

As thus configured, the modular control circuit includes the same number of sense amplifiers as the number of data bits in a memory page for sensing or driving the bit lines. No selection signal is used to select the sense amplifiers. Rather, bit line selection is used to connect only the memory page size of bit lines to the sense amplifiers. This configuration enables a compact modular control circuit to be formed, realizes simplicity in circuit design and control and enables high bandwidth operation.

In the above described embodiments, the memory device includes an array of tiles where each tile provides an access unit of memory data, such as a memory page of memory data (e.g. 512 bits). It is instructive to note that the above description is concerned with memory operations in response to host requests where each memory access from the host is based on the access unit of memory data. In actual implementation, each tile may perform additional supportive memory operations, such as refresh or wear leveling, that is not part of the host memory request. In some cases, each memory operation executed in a tile to a targeted memory page may include additional supportive memory operation to another related memory page in the same tile. The modular control circuit (CuA) controls the supportive memory operation, in cooperation with the memory controller.

In embodiments of the present disclosure, the write operation is performed together with a partial refresh operation where each time a memory page is to be written, another memory page associated with the same word line is selected to be refreshed at the same time. As described above, a destination memory address actives a selected word line which activates P number of memory pages. While one of the P memory pages is selected for the write operation, the partial refresh operation selects another memory page belonging to the activated word line for refresh. The partial refresh operation can be advantageously applied to reduce disturb that may be experienced by the non-selected storage transistors associated with the activated word line. The partial refresh operation is described in copending and commonly assigned U.S. patent application Ser. No. 17/525, 712, entitled "Methods For Reducing Disturb Errors By Refreshing Data Alongside Programming Or Erase Operations," by Raul Adrian Cernea, filed Nov. 12, 2021, which application is incorporated by reference in its entirety. When the partial refresh operation is implemented, each write operation in a tile is performed on a designated memory page and a memory page to be refreshed—that is, each write operation is performed on two memory pages. However, the memory access unit remains a single memory page as only one of the memory pages is being written with the incoming write data while the other memory page only has its contented refreshed. The present description of a memory operation being performed in a tile based on an access unit of memory data does not preclude additional supportive memory operations being performed on other memory pages in the same tile.

Furthermore, in the above-described embodiments, the tile based support circuits or modular control circuit (CuA) for each tile is described as being formed in or on the same semiconductor substrate on which the arrays of storage transistors are formed. In alternate embodiments, the modular control circuit (CuA) may be formed on a separate semiconductor substrate, different from the semiconductor substrate on which the storage transistors are formed. In such configurations, the memory arrays of storage transistors are formed on a first semiconductor die and the modular control circuits for each array of storage transistors are formed on a second semiconductor die. A memory device is formed by electrically and mechanically connecting the first semiconductor die to the second semiconductor die so that each memory array and an associated modular control circuit form a tile in the memory device and the memory device includes an array of tiles formed by bonding of the first and second semiconductor dies. The tiles, including the modular control circuits and the associated memory arrays, may be individually addressed by an external memory controller.

For instance, the tile 201 of FIG. 9 may be formed by two semiconductor dies with the memory array portion 210 formed on a first semiconductor die and the modular control circuit formed on a second semiconductor die. The second semiconductor die may be bonded to the first semiconductor die through interconnect structures formed at the underside (or bottom) or the topside of the memory array portion 210. For example, the interconnect structures may be hybrid bonds. Forming the memory array portion and the modular control circuit on separate semiconductor dies has the beneficial effect of enabling the fabrication processes to be separately optimized for the memory circuits and the control circuits.

In some embodiments, the circuitry of each modular control circuit may be partitioned with some of the control circuits formed under or above the memory arrays of storage transistors in the first semiconductor die and remaining control circuits formed in the second semiconductor die. For example, the bit line selector/driver circuits for each tile may be formed in or on the semiconductor substrate of the first semiconductor die under the respective memory array. Alternately, in another example, the bit line selector/driver circuits for each tile may be formed as vertical thin film transistors above the respective memory array (opposite the semiconductor substrate). In this manner, the first semiconductor die only needs to provide global bit line connections to the second semiconductor die. As thus configured, the memory device of the present invention may be constructed in various manner to provide an array of tiles of storage transistors with modular control circuits. The memory device may be formed on a monolithic semiconductor die or may be formed in a multi-die configuration to enable fabrication process optimization between the memory circuits and the support circuits. Whether formed monolithically or in a multi-die configuration, the memory tiles, including the modular control circuits and the associated memory arrays, may be individually addressed by an external memory controller.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A memory device, comprising:

a plurality of tiles of memory circuits, each tile comprising a physically isolated array of storage transistors ("memory array") electrically coupled to and operated by a modular control circuit, the memory array comprising a three-dimensional array of storage transistors being organized in a plurality of memory pages of storage transistors, each storage transistor being accessed by a word line and a bit line, the modular control circuit being in communication with the memory array to perform memory operations on one or more memory pages of storage transistors, wherein each tile is configurable to be individually addressed and independently operated by the associated modular control circuit to perform memory operations in units of memory pages of storage transistors in the memory array in response to memory access commands designated for the tile, and wherein two or more randomly addressed tiles of memory circuits are configurable to perform overlapping memory operation simultaneously; and wherein the modular control circuits of the plurality of tiles interact with a memory controller integrated circuit formed on a separate semiconductor substrate, each modular control circuit in a tile receiving a memory access command designated to the tile with a memory address associated with the command, and the memory address designating one memory page in the memory array for performing a memory operation specified by the memory access command; and each physically isolated memory array in each tile comprises a three-dimensional array of NOR memory strings of randomly accessible storage transistors, and one or more staircase structures connecting bit lines of the NOR memory string to the modular control circuit, and each modular control circuit in the plurality of tiles are replicated complete control circuit for each tile; and wherein each modular control circuit comprises bit line driver circuits coupled to the bit lines of the memory array through the staircase structures, the bit line driver circuits selecting bit lines of a memory page designated by the memory address and drive bias voltages in response to the memory operation specified by the memory access command; and word line driver circuits coupled to select a word line of the memory array to activate a first number of memory pages of storage transistors, wherein the bit line driver circuits are placed in a portion of the modular control circuit under the staircase structures of the memory array and the word line driver circuits are placed in a center portion of the modular control circuit.

2. The memory device of claim 1, wherein the plurality of tiles of memory circuits are formed on a semiconductor substrate where each tile includes the physically isolated array of storage transistors formed above a planar surface of the semiconductor substrate and the modular control circuit formed under the memory array on or in the semiconductor substrate.

3. The memory device of claim 1, wherein the plurality of tiles of memory circuits comprise a plurality of physically isolated arrays of storage transistors formed on a first semiconductor die and corresponding modular control circuits for the arrays of storage transistors formed on a second semiconductor die, the first semiconductor die being electrically and mechanically connected to the second semiconductor die so that each memory array and an associated modular control circuit form a tile in the memory device.

4. The memory device of claim 1, wherein the plurality of tiles of memory circuits comprise a plurality of physically isolated arrays of storage transistors and at least part of the circuitry of the modular control circuits form on a first semiconductor die and remaining corresponding modular control circuits for the arrays of storage transistors formed on a second semiconductor die, the first semiconductor die being electrically and mechanically connected to the second semiconductor die so that each memory array with part of the circuitry and an associated modular control circuit form a tile in the memory device.

5. The memory device of claim 1, wherein each memory access command is based on an access unit of memory data, the access unit being a memory page, and a modular control circuit of a tile performs memory operation on a memory page of storage transistors in response to each memory access command designated for the tile.

6. The memory device of claim 5, wherein an access unit of memory data comprises 512 bits and a memory page of storage transistors comprises 512 storage transistors.

7. The memory device of claim 1, wherein, in each memory array, each word line activates a first number of memory pages and the modular control circuit selects bit lines associated with a first memory page of storage transistors to perform memory operations in response to a memory access command.

8. The memory device of claim 1, wherein each of the plurality of tiles of memory circuits comprises a quasi-volatile memory circuit.

9. The memory device of claim 8, wherein the storage transistors of the quasi-volatile memory circuit in each memory array are refreshed at an interval of 10 minutes or more.

10. The memory device of claim 8, wherein the storage transistors in each memory array each comprises a storage material programmable by a direct tunneling technique.

11. The memory device of claim 8, wherein the storage transistors in each memory array each comprises a ferro-electric storage transistor.

12. The memory device of claim 1, wherein the three dimensional array of NOR memory strings are arranged in parallel in a first direction and stacked in multiple layers a second direction, each NOR memory string including a plurality of storage transistors sharing a common source line and a common drain line, with each layer of NOR memory strings extending along a third direction, the array of NOR memory strings further comprising:

(i) a plurality of local word line structures formed between adjacent stacks of NOR memory strings, and (ii) a plurality of word lines formed above the three dimensional array and extending in the first direction, each word line being connected to a respective subset of the local word line structures, wherein each storage transistor is formed at the junction of each NOR memory string and each local word line structure, each storage transistor comprising (i) a channel region formed between the common source layer and the common drain layer, (ii) a gate dielectric layer and (iii) the local word line structure as a gate conductor.

13. The memory device of claim 12, wherein each modular control circuit has the same dimensions in the first and third directions as its associated memory array.

14. The memory device of claim 1, wherein each memory access command specifies memory operations comprising read, write and refresh operations, the memory access command providing write data with a write operation command.

15. The memory device of claim 1, wherein in response to the memory address associated with a memory access command, the modular control circuit of the designated tile selects one of the word lines in the memory array through the word line driver circuits to activate the first number of memory pages, and the modular control circuit further selects bit lines of one memory page from the first number of activated memory pages to perform the memory operation indicated by the associated memory access command.

16. The memory device of claim 1, wherein each modular control circuit in a tile further comprises a tile logic circuit comprising a processor unit to decode memory access commands and execute memory operation sequences at the memory array of the tile to perform the memory operations specified by the memory access commands, wherein the tile logic circuit generates control signals to execute the memory operation sequence of each memory access command and to control the timing sequence for performing the memory operation sequence.

17. The memory device of claim 1, wherein each modular control circuit in a tile further comprises sense amplifier circuits coupled to the selected bit lines of the bit line driver circuits to sense or to drive the selected bit lines in response to the memory access command, the sense amplifier circuits including a second number of sense amplifiers, the second number being equal to a number of data bits in an access unit of memory data associated with the memory access command, an access unit being equal to a memory page.

18. The memory device of claim 17, wherein each modular control circuit in a tile further comprises a plurality of data latches for storing read data retrieved from the memory array in response to a read operation and for storing write data to be stored in the memory array in response to a write operation.

* * * * *